United States Patent
Chang et al.

(10) Patent No.: US 8,841,773 B2
(45) Date of Patent: Sep. 23, 2014

(54) MULTI-LAYER INTERCONNECT STRUCTURE FOR STACKED DIES

(75) Inventors: Hung-Pin Chang, Taipei (TW);
Chien-Ming Chiu, Hsin-Chu (TW);
Tsang-Jiuh Wu, Hsin-Chu (TW);
Shau-Lin Shue, Hsin-Chu (TW);
Chen-Hua Yu, Hsin-Chu (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 0 days.

(21) Appl. No.: 13/608,456

(22) Filed: Sep. 10, 2012

(65) Prior Publication Data

US 2013/0001799 A1  Jan. 3, 2013

Related U.S. Application Data

(62) Division of application No. 12/750,100, filed on Mar. 30, 2010, now Pat. No. 8,466,059.

(51) Int. Cl.
| | |
|---|---|
| *H01L 23/48* | (2006.01) |
| *H01L 23/52* | (2006.01) |
| *H01L 21/768* | (2006.01) |
| *H01L 21/683* | (2006.01) |
| *H01L 23/00* | (2006.01) |
| *H01L 23/525* | (2006.01) |

(52) U.S. Cl.
CPC . *H01L 21/76898* (2013.01); *H01L 2224/13022* (2013.01); *H01L 24/14* (2013.01); *H01L 2224/13116* (2013.01); *H01L 2924/01327* (2013.01); *H01L 23/525* (2013.01); *H01L 2224/13109* (2013.01); *H01L 2224/13139* (2013.01); *H01L 2221/68359* (2013.01); *H01L 21/6835* (2013.01); *H01L 2224/13147* (2013.01); *H01L 2224/14181* (2013.01); *H01L 2224/13111* (2013.01); *H01L 2224/13144* (2013.01); *H01L 2224/13184* (2013.01); *H01L 2924/01019* (2013.01); *H01L 24/13* (2013.01); *H01L 2224/13155* (2013.01)
USPC .................. 257/774; 257/758; 257/E23.174

(58) Field of Classification Search
CPC .............. H01L 23/481; H01L 23/5226; H01L 23/5329; H01L 2924/01078; H01L 2225/06541
USPC ................................... 257/758, 774, E23.174
See application file for complete search history.

(56) References Cited

U.S. PATENT DOCUMENTS

| | | |
|---|---|---|
| 5,391,917 A | 2/1995 | Gilmour et al. |
| 5,426,072 A | 6/1995 | Finnila |

(Continued)

FOREIGN PATENT DOCUMENTS

| | | |
|---|---|---|
| CN | 101752336 A | 6/2010 |
| JP | 2009004730 A | 1/2009 |

(Continued)

OTHER PUBLICATIONS

Ranganathan, N., et al., "Integration of High Aspect Ratio Tapered Silicon Via for Through-Silicon Interconnection," 2008 Electronic Components and Technology Conference, 2008, pp. 859-865.

*Primary Examiner* — Nitin Parekh
(74) *Attorney, Agent, or Firm* — Slater and Matsil, L.L.P.

(57) ABSTRACT

A multi-layer interconnect structure for stacked die configurations is provided. Through-substrate vias are formed in a semiconductor substrate. A backside of the semiconductor substrate is thinned to expose the through-substrate vias. An isolation film is formed over the backside of the semiconductor substrate and the exposed portion of the through-substrate vias. A first conductive element is formed electrically coupled to respective ones of the through-substrate vias and extending over the isolation film. One or more additional layers of isolation films and conductive elements may be formed, with connection elements such as solder balls being electrically coupled to the uppermost conductive elements.

20 Claims, 21 Drawing Sheets

(56) References Cited

U.S. PATENT DOCUMENTS

| | | |
|---|---|---|
| 5,510,298 A | 4/1996 | Redwine |
| 5,646,067 A | 7/1997 | Gaul |
| 5,767,001 A | 6/1998 | Bertagnolli et al. |
| 5,998,292 A | 12/1999 | Black et al. |
| 6,034,436 A | 3/2000 | Iwasaki |
| 6,184,060 B1 | 2/2001 | Siniaguine |
| 6,322,903 B1 | 11/2001 | Siniaguine et al. |
| 6,417,087 B1 | 7/2002 | Chittipeddi et al. |
| 6,448,168 B1 | 9/2002 | Rao et al. |
| 6,451,684 B1 | 9/2002 | Kim et al. |
| 6,465,892 B1 | 10/2002 | Suga |
| 6,472,293 B1 | 10/2002 | Suga |
| 6,498,381 B2 | 12/2002 | Halahan et al. |
| 6,538,333 B2 | 3/2003 | Kong |
| 6,599,778 B2 | 7/2003 | Pogge et al. |
| 6,639,303 B2 | 10/2003 | Siniaguine |
| 6,664,129 B2 | 12/2003 | Siniaguine |
| 6,693,361 B1 | 2/2004 | Siniaguine et al. |
| 6,740,582 B2 | 5/2004 | Siniaguine |
| 6,764,950 B2 | 7/2004 | Noguchi et al. |
| 6,770,528 B2 | 8/2004 | Furukawa et al. |
| 6,800,930 B2 | 10/2004 | Jackson et al. |
| 6,838,774 B2 | 1/2005 | Patti |
| 6,841,883 B1 | 1/2005 | Farnworth et al. |
| 6,873,054 B2 | 3/2005 | Miyazawa et al. |
| 6,882,030 B2 | 4/2005 | Siniaguine |
| 6,897,125 B2 | 5/2005 | Morrow et al. |
| 6,908,856 B2 | 6/2005 | Beyne et al. |
| 6,914,336 B2 * | 7/2005 | Matsuki et al. ............... 257/769 |
| 6,924,551 B2 | 8/2005 | Rumer et al. |
| 6,962,867 B2 | 11/2005 | Jackson et al. |
| 6,962,872 B2 | 11/2005 | Chudzik et al. |
| 7,015,581 B2 | 3/2006 | Casey et al. |
| 7,030,481 B2 | 4/2006 | Chudzik et al. |
| 7,049,170 B2 | 5/2006 | Savastiouk et al. |
| 7,053,465 B2 | 5/2006 | Benaissa et al. |
| 7,060,601 B2 | 6/2006 | Savastiouk et al. |
| 7,071,546 B2 | 7/2006 | Fey et al. |
| 7,111,149 B2 | 9/2006 | Eilert |
| 7,122,912 B2 | 10/2006 | Matsui |
| 7,157,787 B2 | 1/2007 | Kim et al. |
| 7,186,343 B2 | 3/2007 | Rabie et al. |
| 7,186,643 B2 | 3/2007 | Ahn et al. |
| 7,193,308 B2 | 3/2007 | Matsui |
| 7,224,063 B2 | 5/2007 | Agarwala et al. |
| 7,262,495 B2 | 8/2007 | Chen et al. |
| 7,297,574 B2 | 11/2007 | Thomas et al. |
| 7,300,857 B2 | 11/2007 | Akram et al. |
| 7,335,972 B2 | 2/2008 | Chanchani |
| 7,354,798 B2 | 4/2008 | Pogge et al. |
| 7,355,273 B2 | 4/2008 | Jackson et al. |
| 7,358,180 B2 | 4/2008 | Sakai et al. |
| 7,514,775 B2 | 4/2009 | Chao et al. |
| 7,528,068 B2 | 5/2009 | Soejima et al. |
| 7,541,677 B2 | 6/2009 | Kawano |
| 7,544,605 B2 * | 6/2009 | Sparks et al. ............... 438/622 |
| 7,772,081 B2 | 8/2010 | Lin et al. |
| 7,772,116 B2 | 8/2010 | Akram et al. |
| 7,816,227 B2 | 10/2010 | Chen et al. |
| 7,855,455 B2 | 12/2010 | Purushothaman et al. |
| 7,863,187 B2 | 1/2011 | Hiatt et al. |
| 7,915,710 B2 | 3/2011 | Lee et al. |
| 7,919,835 B2 | 4/2011 | Akiyama |
| 7,968,460 B2 * | 6/2011 | Kirby et al. ............... 438/667 |
| 7,969,016 B2 | 6/2011 | Chen et al. |
| 7,973,415 B2 | 7/2011 | Kawashita et al. |
| 7,999,320 B2 | 8/2011 | Botula et al. |
| 8,026,592 B2 | 9/2011 | Yoon et al. |
| 8,034,704 B2 | 10/2011 | Komai et al. |
| 8,058,708 B2 | 11/2011 | Maebashi |
| 8,097,961 B2 | 1/2012 | Tanaka et al. |
| 8,097,964 B2 | 1/2012 | West et al. |
| 8,174,124 B2 | 5/2012 | Chiu et al. |
| 8,193,092 B2 | 6/2012 | Pratt |
| 8,247,322 B2 | 8/2012 | Chang et al. |
| 8,264,077 B2 | 9/2012 | Chiou et al. |
| 8,294,261 B2 | 10/2012 | Mawatari et al. |
| 8,399,354 B2 | 3/2013 | Chen |
| 8,466,059 B2 | 6/2013 | Chang et al. |
| 8,513,119 B2 | 8/2013 | Chang et al. |
| 8,513,778 B2 | 8/2013 | Tokitoh |
| 2002/0084513 A1 | 7/2002 | Siniaguine |
| 2002/0113321 A1 | 8/2002 | Siniaguine |
| 2002/0182855 A1 | 12/2002 | Agarwala et al. |
| 2003/0148600 A1 | 8/2003 | Furukawa et al. |
| 2004/0048459 A1 | 3/2004 | Patti |
| 2004/0188822 A1 | 9/2004 | Hara |
| 2004/0245623 A1 * | 12/2004 | Hara et al. ............... 257/698 |
| 2004/0248398 A1 | 12/2004 | Ahn et al. |
| 2005/0194691 A1 | 9/2005 | Sakai et al. |
| 2005/0200025 A1 | 9/2005 | Casey et al. |
| 2005/0221601 A1 | 10/2005 | Kawano |
| 2005/0233581 A1 | 10/2005 | Soejima et al. |
| 2006/0273465 A1 | 12/2006 | Tamura |
| 2006/0289968 A1 | 12/2006 | Sulfridge |
| 2007/0032061 A1 | 2/2007 | Farnworth et al. |
| 2007/0049016 A1 | 3/2007 | Hiatt et al. |
| 2007/0172985 A1 | 7/2007 | Huang et al. |
| 2008/0054444 A1 | 3/2008 | Tuttle |
| 2008/0136023 A1 | 6/2008 | Komai et al. |
| 2008/0211106 A1 | 9/2008 | Chang et al. |
| 2008/0315433 A1 | 12/2008 | Chen et al. |
| 2009/0014843 A1 | 1/2009 | Kawashita et al. |
| 2009/0032960 A1 | 2/2009 | Pratt |
| 2009/0032966 A1 | 2/2009 | Lee et al. |
| 2009/0057909 A1 | 3/2009 | Strothmann |
| 2009/0149023 A1 | 6/2009 | Koyanagi |
| 2009/0152602 A1 | 6/2009 | Akiyama |
| 2009/0250739 A1 | 10/2009 | Johnson et al. |
| 2009/0269905 A1 | 10/2009 | Chen et al. |
| 2009/0283898 A1 | 11/2009 | Janzen et al. |
| 2009/0315184 A1 | 12/2009 | Tokitoh |
| 2010/0013060 A1 | 1/2010 | Lamy et al. |
| 2010/0038800 A1 | 2/2010 | Yoon et al. |
| 2010/0078770 A1 | 4/2010 | Purushothaman et al. |
| 2010/0127394 A1 | 5/2010 | Ramiah et al. |
| 2010/0140805 A1 | 6/2010 | Chang et al. |
| 2010/0164117 A1 | 7/2010 | Chen |
| 2010/0171197 A1 | 7/2010 | Chang et al. |
| 2010/0171226 A1 | 7/2010 | West et al. |
| 2010/0176494 A1 * | 7/2010 | Chen ............... 257/621 |
| 2010/0330798 A1 | 12/2010 | Huang et al. |
| 2011/0049706 A1 | 3/2011 | Huang et al. |
| 2011/0068466 A1 | 3/2011 | Chen et al. |
| 2011/0165776 A1 | 7/2011 | Hsu et al. |
| 2011/0186990 A1 | 8/2011 | Mawatari et al. |
| 2011/0204969 A1 | 8/2011 | Chen et al. |
| 2011/0227216 A1 | 9/2011 | Tseng et al. |
| 2011/0233785 A1 | 9/2011 | Koester et al. |
| 2011/0241217 A1 | 10/2011 | Chang et al. |
| 2011/0266691 A1 | 11/2011 | Lin et al. |
| 2011/0318917 A1 | 12/2011 | Yoon et al. |
| 2012/0001337 A1 | 1/2012 | Tsai et al. |
| 2012/0018863 A1 | 1/2012 | Oganesian et al. |
| 2012/0211892 A1 | 8/2012 | Kim et al. |
| 2012/0295437 A1 | 11/2012 | Lu et al. |
| 2012/0313247 A1 | 12/2012 | Yu et al. |
| 2013/0001799 A1 | 1/2013 | Chang et al. |
| 2013/0299992 A1 | 11/2013 | Chang et al. |

FOREIGN PATENT DOCUMENTS

| | | |
|---|---|---|
| JP | 2009147218 A | 7/2009 |
| KR | 2006-0054688 A | 5/2006 |
| KR | 2006-0054689 A | 5/2006 |
| KR | 2006-0054690 A | 5/2006 |
| KR | 20080101635 A | 11/2008 |
| TW | 531892 A | 5/2003 |
| TW | 200737551 | 10/2007 |
| TW | 200910557 A | 3/2009 |
| TW | 201036106 A | 10/2010 |

* cited by examiner

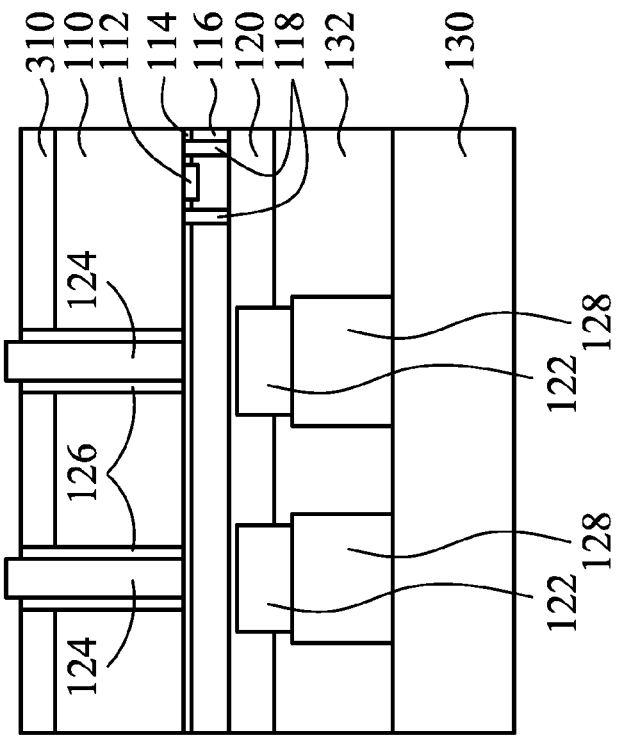
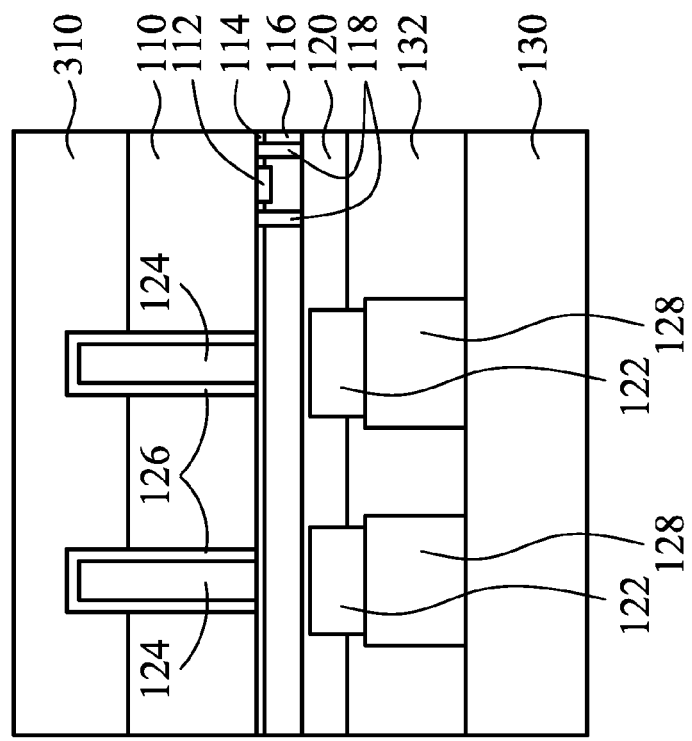

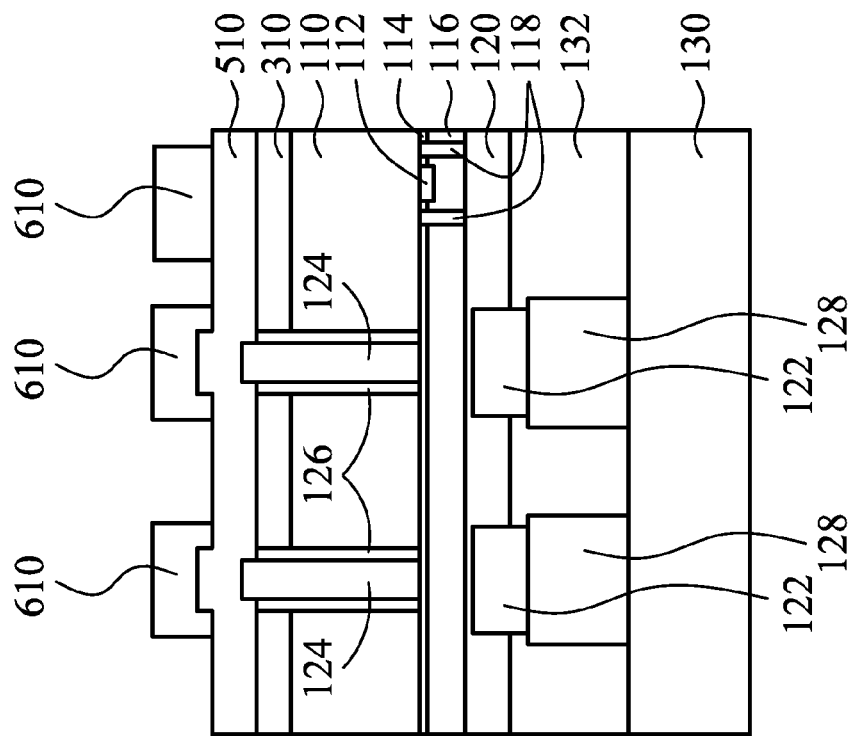
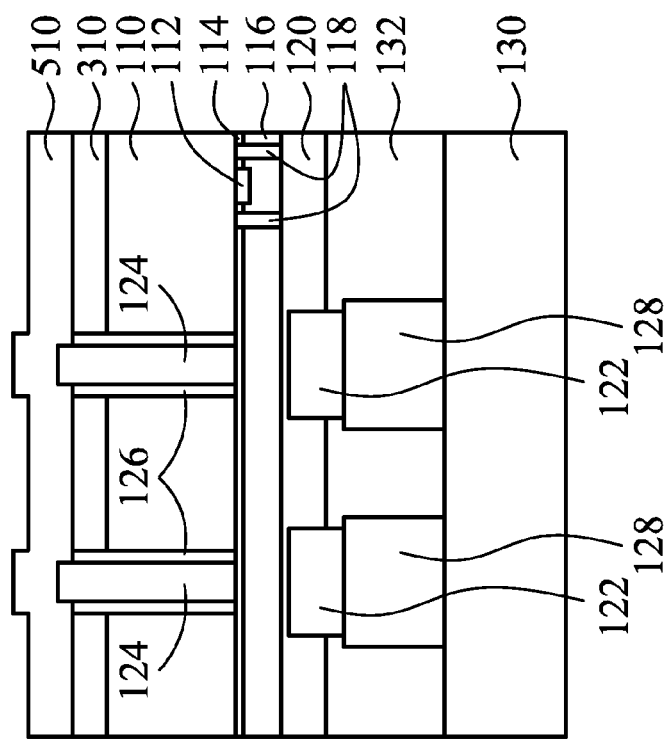

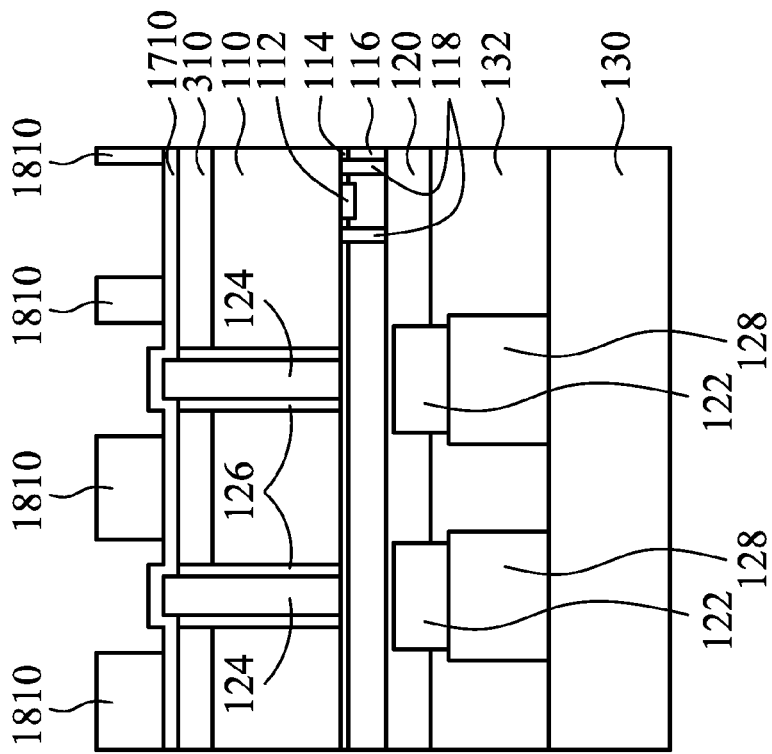
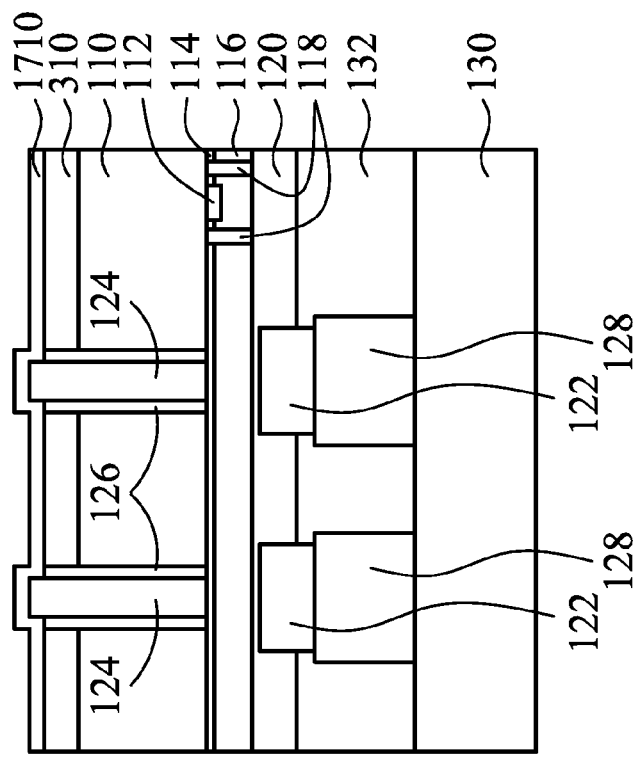

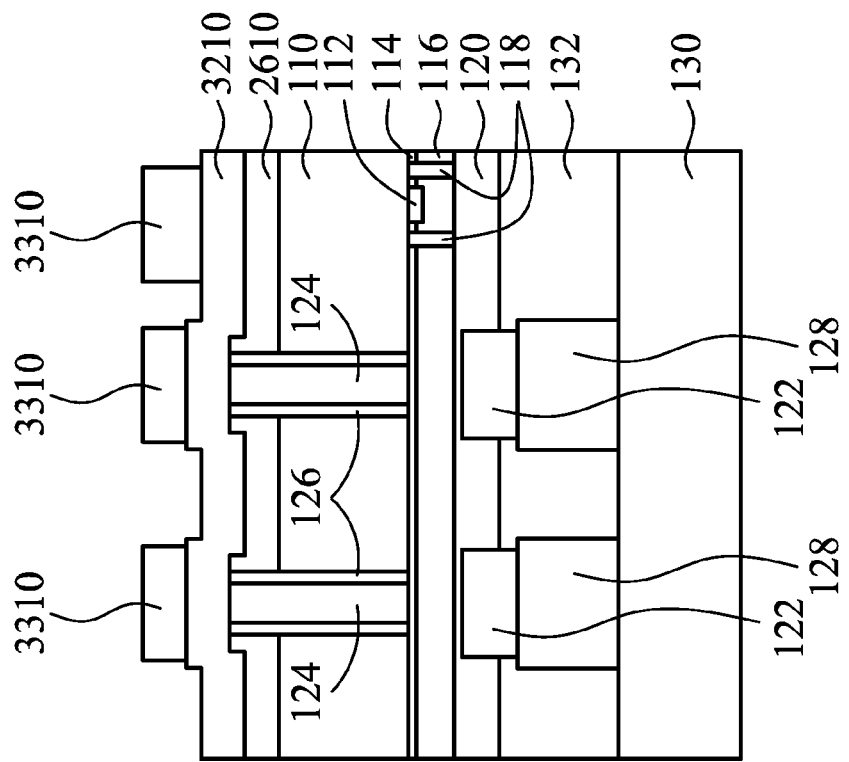
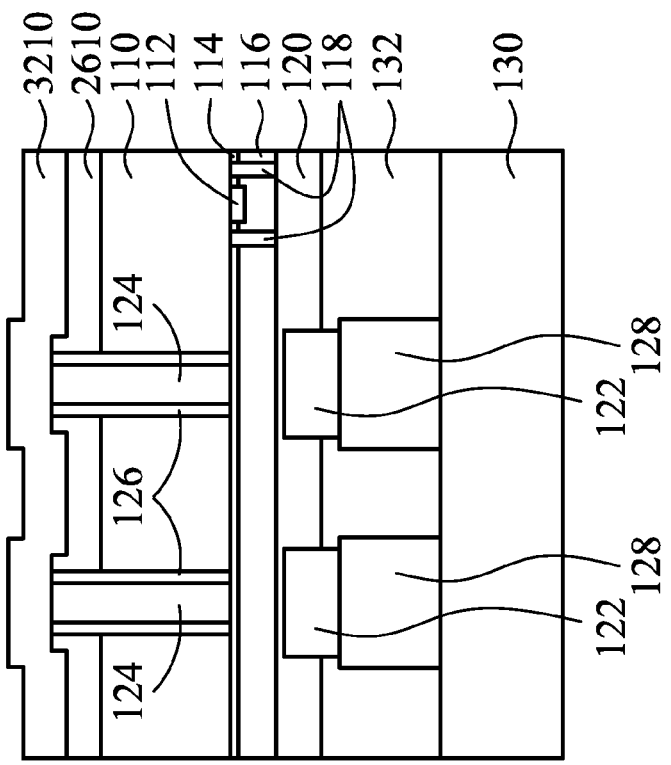

US 8,841,773 B2

MULTI-LAYER INTERCONNECT STRUCTURE FOR STACKED DIES

RELATED APPLICATIONS

This application is a divisional of U.S. patent application Ser. No. 12/750,100, filed on Mar. 30, 2010, which is herein incorporated by reference.

TECHNICAL FIELD

This disclosure relates generally to integrated circuits and, more particularly, to interconnect structures for use with semiconductor dies having through-substrate vias for stacked die configurations.

BACKGROUND

Since the invention of the integrated circuit (IC), the semiconductor industry has experienced rapid growth due to continuous improvements in the integration density of various electronic components (e.g., transistors, diodes, resistors, capacitors, etc.). For the most part, this improvement in integration density has come from repeated reductions in minimum feature size, which allows more components to be integrated into a given area.

These integration improvements are essentially two-dimensional (2D) in nature, in that the volume occupied by the integrated components is essentially on the surface of the semiconductor wafer. Although dramatic improvements in lithography have resulted in considerable improvement in 2D IC formation, there are physical limits to the density that can be achieved in two dimensions. One of these limits is the minimum size needed to make these components. Also, when more devices are put into one chip, more complex designs are required.

In an attempt to further increase circuit density, three-dimensional (3D) ICs have been investigated. In a typical formation process of a 3D IC, two dies are bonded together and electrical connections are formed between each die and contact pads on a substrate. For example, one attempt involved bonding two dies on top of each other. The stacked dies were then bonded to a carrier substrate and wire bonds electrically coupled contact pads on each die to contact pads on the carrier substrate. This attempt, however, requires a carrier substrate larger than the dies for the wire bonding.

More recent attempts have focused on through-substrate vias (TSVs). Generally, a TSV is formed by etching a vertical via through a substrate and filling the via with a conductive material, such as copper. The backside of the substrate is thinned to expose the TSVs, and another die is bonded to the exposed TSVs, thereby forming a stacked die package.

SUMMARY

In accordance with one aspect of an embodiment, a multi-layer interconnect structure for stacked die configurations is provided. A substrate having through-substrate vias is provided such that the through-substrate vias are exposed. An isolation film is formed over a backside of the substrate and first conductive elements are electrically coupled to respective ones of the through-substrate vias and extending over the isolation film. One or more additional layers of isolation films and conductive elements may be formed, with connection elements such as solder balls being electrically coupled to the uppermost conductive elements.

Other embodiments are also disclosed.

BRIEF DESCRIPTION OF THE DRAWINGS

For a more complete understanding of the embodiments, and the advantages thereof, reference is now made to the following descriptions taken in conjunction with the accompanying drawings, in which:

FIGS. 1-16 illustrate an embodiment in which a multi-layer interconnect structure is provided;

FIGS. 17-25 illustrate another embodiment in which a multi-layer interconnect structure is provided;

FIGS. 26-35 illustrate yet another embodiment in which a multi-layer interconnect structure is provided.

DETAILED DESCRIPTION

The making and using of the embodiments of the disclosure are discussed in detail below. It should be appreciated, however, that the embodiments provide many applicable inventive concepts that can be embodied in a wide variety of specific contexts. The specific embodiments discussed are merely illustrative of specific ways to make and use the embodiments, and do not limit the scope of the disclosure.

Embodiments described herein relate to the use of an interconnect structure with a substrate having through-substrate vias. As will be discussed below, embodiments are disclosed that integrate a multi-layer interconnect structure and redistribution layers, thereby enabling flexibility with different pin configurations. It should be noted that for purposes of illustration, embodiments having two interconnect layers are illustrated. In other embodiments, processes such as those discussed herein or other similar processes may be used to create a multi-layer interconnect structure having more than two interconnect layers.

The intermediate stages of a first method for forming a die having an interconnect structure and/or a redistribution layer suitable for use in a three-dimensional (3D) integrated circuit (IC) or stacked die configuration are illustrated in FIGS. 1-16. Throughout the various views and illustrative embodiments like reference numbers are used to designate like elements.

Figure 1:
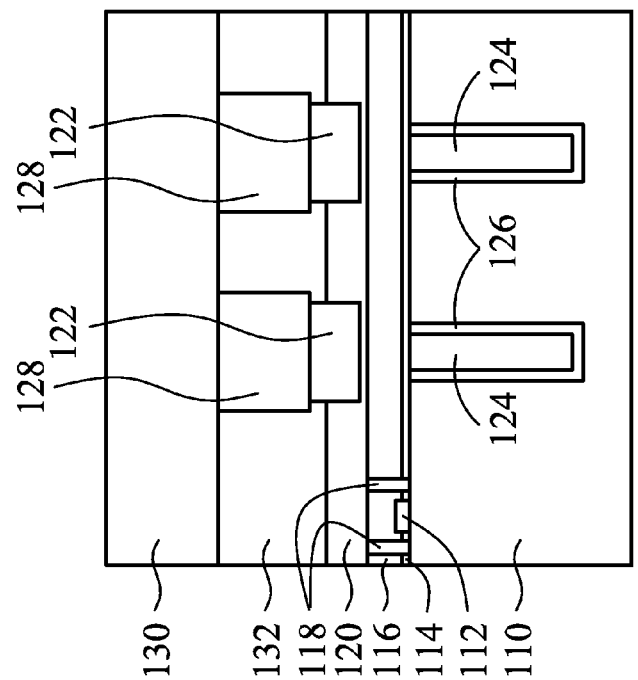

Referring first to FIG. 1, a semiconductor substrate 110 having electrical circuitry 112 formed thereon is shown. The semiconductor substrate 110 may comprise, for example, bulk silicon, doped or undoped, or an active layer of a semiconductor-on-insulator (SOI) substrate. Generally, an SOI substrate comprises a layer of a semiconductor material, such as silicon, formed on an insulator layer. The insulator layer may be, for example, a buried oxide (BOX) layer or a silicon oxide layer. The insulator layer is provided on a substrate, typically a silicon or glass substrate. Other substrates, such as a multi-layered or gradient substrate may also be used.

The electrical circuitry 112 formed on the semiconductor substrate 110 may be any type of circuitry suitable for a particular application. In an embodiment, the circuitry includes electrical devices formed on the substrate with one or more dielectric layers overlying the electrical devices. Metal layers may be formed between dielectric layers to route electrical signals between the electrical devices. Electrical devices may also be formed in one or more dielectric layers.

For example, the electrical circuitry 112 may include various N-type metal-oxide semiconductor (NMOS) and/or P-type metal-oxide semiconductor (PMOS) devices, such as transistors, capacitors, resistors, diodes, photo-diodes, fuses, and the like, interconnected to perform one or more functions.

The functions may include memory structures, processing structures, sensors, amplifiers, power distribution, input/output circuitry, or the like. One of ordinary skill in the art will appreciate that the above examples are provided for illustrative purposes only to further explain illustrative applications and are not meant to limit other embodiments in any manner. Other circuitry may be used as appropriate for a given application.

Also shown in FIG. 1 are an etch stop layer 114 and an inter-layer dielectric (ILD) layer 116. The etch stop layer 114 is formed of a dielectric material having a different etch selectivity from adjacent layers, e.g., the underlying semiconductor substrate 110 and the overlying ILD layer 116. In an embodiment, the etch stop layer 114 may be formed of SiN, SiCN, SiCO, CN, combinations thereof, or the like, deposited by chemical vapor deposition (CVD) or plasma-enhanced CVD (PECVD) techniques.

The ILD layer 116 may be formed, for example, of a low-K dielectric material, such as silicon oxide, phosphosilicate glass (PSG), borophosphosilicate glass (BPSG), fluorinated silicate glass (FSG), $SiO_xC_y$, Spin-On-Glass, Spin-On-Polymers, silicon carbon material, compounds thereof, composites thereof, combinations thereof, or the like, by any suitable method known in the art, such as spinning, CVD, and PECVD. It should also be noted that the etch stop layer 114 and the ILD layer 116 may each comprise a plurality of dielectric layers, with or without an etch stop layer formed between adjacent dielectric layers.

Contacts 118 are formed through the ILD layer 116 to provide an electrical contact to the electrical circuitry 112. The contacts 118 may be formed, for example, by using photolithography techniques to deposit and pattern a photoresist material on the ILD layer 116 to expose portions of the ILD layer 116 that are to become the contacts 118. An etch process, such as an anisotropic dry etch process, may be used to create openings in the ILD layer 116. The openings may be lined with a diffusion barrier layer and/or an adhesion layer (not shown), and filled with a conductive material. The diffusion barrier layer may comprise one or more layers of TaN, Ta, TiN, Ti, CoW, or the like, and the conductive material may comprise copper, tungsten, aluminum, silver, and combinations thereof, or the like, thereby forming the contacts 118 as illustrated in FIG. 1.

One or more inter-metal dielectric (IMD) layers 120 and the associated metallization layers (not shown) are formed over the ILD layer 116. Generally, the one or more IMD layers 120 and the associated metallization layers are used to interconnect the electrical circuitry to each other and to provide an external electrical connection. The IMD layers 120 may be formed of a suitable dielectric material, such as a low-K dielectric material, such as FSG formed by PECVD techniques or high-density plasma chemical vapor deposition (HDPCVD), or the like, and may include intermediate etch stop layers, similar to etch stop layer 114. Top metal contacts 122 are provided in the uppermost IMD layer to provide external electrical connections.

Also shown in FIG. 1 are through-substrate vias 124. The through-substrate vias 124 may be formed by any appropriate method. For example, openings may be formed extending into the semiconductor substrate 110 prior to forming the ILD layer 116 by, for example, one or more etching processes, milling, laser techniques, or the like. The openings are lined with a liner, such as liner 126 that acts as an isolation layer, and filled with a conductive material. The liner 126 may comprise one or more dielectric layers such as SiN, an oxide, a polymer, a combination thereof, or the like, and the conductive material may comprise one or more layers of a conductive material such as copper, tungsten, aluminum, silver, combinations thereof, or the like, thereby forming the through-substrate vias 124. Other materials, including conductive diffusion barrier layers, such as TaN, Ta, TiN, Ti, CoW, or the like, may also be used.

It should be noted that the through-substrate vias 124 are illustrated as extending in the semiconductor substrate 110 from a top surface of the semiconductor substrate 110 for illustrative purposes only and that other arrangements may be utilized. For example, in another embodiment the through-substrate vias 124 may extend from a top surface of the ILD layer 116 or one of the IMD layers 120. For example, in an embodiment, the through-substrate vias 124 are formed by creating openings extending into the semiconductor substrate 110 after forming the contacts 118 by, for example, one or more etching processes milling, laser techniques, or the like. The openings may be lined with a liner, such as liner 126, that acts as an isolation layer, and filled with a conductive material as discussed above.

Conductive bumps 128, such as metal bumps formed of Cu, W, CuSn, AuSn, InAu, PbSn, or the like, are formed on the top metal contacts 122, and a carrier substrate 130 is attached to a top surface of the IMD layers 120 using an adhesive 132. Generally, the carrier substrate 130 provides temporary mechanical and structural support during subsequent processing steps. In this manner, damage to the semiconductor substrate 110 is reduced or prevented.

The carrier substrate 130 may comprise, for example, glass, silicon oxide, aluminum oxide, and the like. The adhesive 132 may be any suitable adhesive, such as an ultraviolet (UV) glue, which loses its adhesive property when exposed to UV lights. The thickness of the carrier substrate 130 may be between about a few mils to about tens of mils, depending upon the type of material and the amount of support desired for a particular application.

Figure 2:
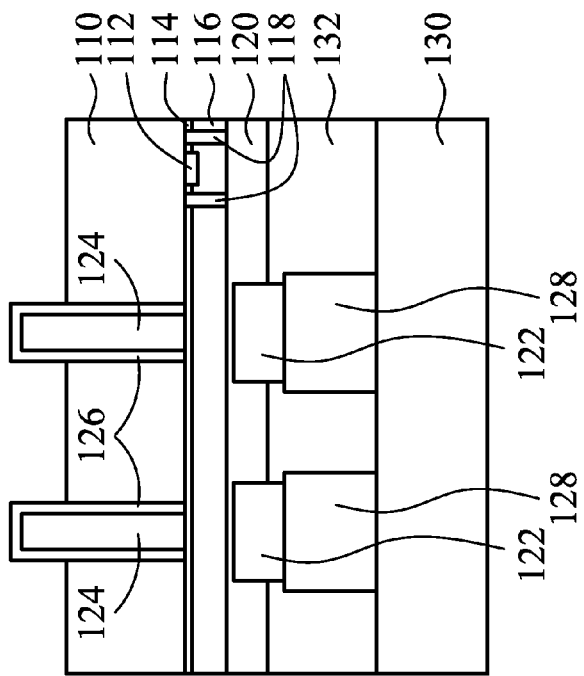

FIG. 2 illustrates a thinning process performed on a backside of the semiconductor substrate 110 to expose the through-substrate vias 124/liners 126 in accordance with an embodiment. The thinning process may be performed using a mechanical grinding process, a chemical mechanical polishing (CMP) process, an etching process, and/or a combination thereof. For example, initially a planarizing process, such as grinding or a CMP may be performed to initially expose the through-substrate vias 124. Thereafter, a wet or dry etching process having a high etch-rate selectivity between the material of the liners 126 and the material of the semiconductor substrate 110 may be performed to recess the semiconductor substrate 110, thereby leaving the through-substrate vias 124 and the liners 126 protruding from the underside of the semiconductor substrate 110 as illustrated in FIG. 2. In an embodiment in which the through-substrate vias 124 are formed of copper and the liners 126 are formed of TaN, the semiconductor substrate 110 may be recessed by, for example, performing a dry etch process using $HBr/O_2$, $HBr/Cl_2/O_2$, $SF_6/CL_2$, $SF_6$ plasma, or the like. In an embodiment, the through-substrate vias 124 and the liners 126 are exposed in the range of about sub-μm to about a few μms.

FIG. 3 illustrates a first isolation film 310 formed over the backside of the semiconductor substrate 110 (or a native oxide that may be formed on the surface of the semiconductor substrate 110). In an embodiment, the first isolation film 310 is a dielectric material, such as SiN, an oxide, SiC, SiON, a polymer, or the like, and may be formed by, for example, spin-coating, printing, a CVD process, or the like. The first isolation film 310 may be formed using a low-temperature process, e.g., using temperatures less than 250° C. by a PECVD process, preventing the bonding adhesive from degrading to ensure the mechanical strength throughout the integration process. As illustrated in the embodiment of FIG. 3, the first isolation film 310 is formed having a thickness sufficient to cover the exposed through-substrate vias 124.

Depending on the process utilized to form the first isolation film 310, it may be desirable to perform a planarization process. In particular, some methods of deposition, such as spin-coating, create a planar surface, but other methods, such as a CVD process, form a conformal layer, and as a result, it may be desirable to perform a planarization process, such as a grinding or CMP process, to create a planar surface as illustrated in FIG. 3.

FIG. 4 illustrates a second exposure of the through-substrate vias 124 in accordance with an embodiment. The thinning process may be performed using a mechanical grinding process, a CMP process, an etching process, and/or a combination thereof. For example, initially a planarizing process, such as grinding or a CMP may be performed to initially expose the through-substrate vias 124. Thereafter, a wet or dry etching process having a high etch-rate selectivity between the material of the through-substrate vias 124 and the liners 126 and the material of the first isolation film 310 may be performed to recess the first isolation film 310, thereby leaving the through-substrate vias 124 protruding from the underside of the first isolation film 310 as illustrated in FIG. 4. In an embodiment in which the through-substrate vias 124 are formed of copper and the first isolation film 310 is formed of silicon dioxide, the first isolation film 310 may be recessed by performing a wet etch using hydrofluoric acid or a dry etching process using $CF_4$, $CHF_3$, $CH_2F_2$, $C_4F_8$, Ar, $O_2$, or a combination thereof. Other processes and materials may be used. In an embodiment, the through-substrate vias 124 are exposed in the range of about sub-μm to about a few μms. FIG. 4 also illustrates removing the liners 126 from the exposed portions of the through-substrate vias 124 along with the recess step of the first isolation film 310. Depending upon the materials used the liners 126 may be removed in the same etching step or a separate etching step may be used.

Referring now to FIG. 5, a first conductive layer 510 is deposited over the surface of the first isolation film 310 and the exposed portions of the through-substrate vias 124. In an embodiment, the first conductive layer 510 may be formed by depositing a conformal conductive layer, such as a layer of Al, an Al alloy, W, Cu, Ti, Ta, TiN, TaN, or the like, using CVD or PVD techniques.

FIG. 6 illustrates a first patterned mask 610 formed over the first conductive layer 510 in accordance with an embodiment. The first patterned mask 610 defines portions of the first conductive layer 510 that will act as conductive pads and redistribution lines as discussed in greater detail below. The first patterned mask 610 may be a patterned photoresist mask, hard mask, a combination thereof, or the like. In an embodiment, a photoresist material is deposited to a thickness of about sub-μms to about several μms and patterned using photolithographic techniques. The first patterned mask 610 may also be a composite layer.

Figure 7:
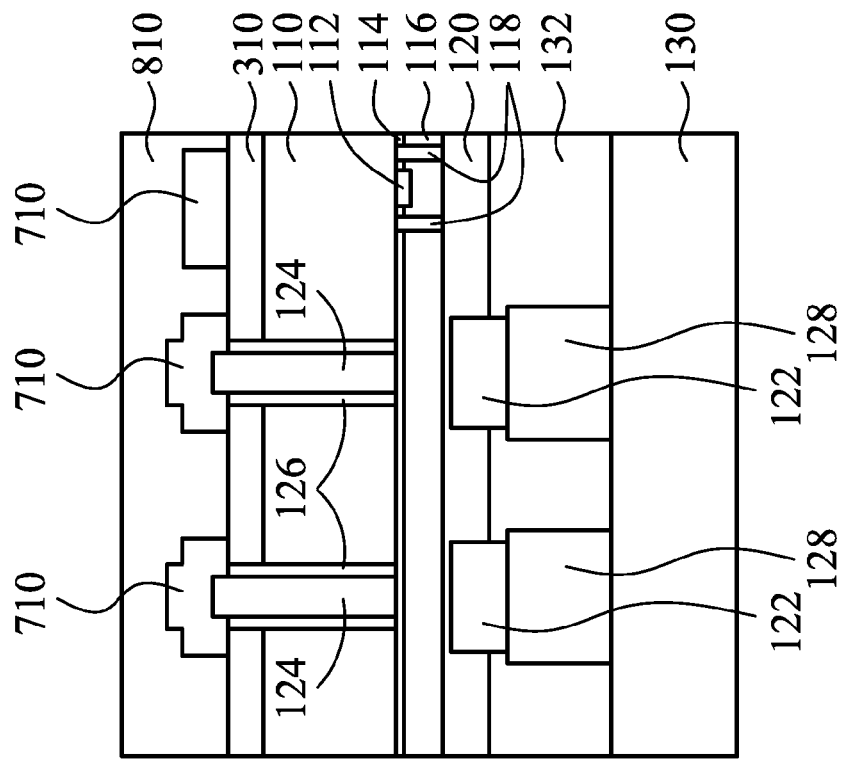

Thereafter, in FIG. 7, an etch process is performed to pattern the first conductive layer 510 to form first conductive elements 710 that act as the conductive pads and redistribution lines. As one of ordinary skill in the art will realize, FIG. 7 illustrates two first conductive elements 710 along the left side generally overlying the through-substrate vias 124, and another first conductive element 710 along the right side, which conductive element does not directly overly a through-substrate via. The first conductive elements 710 act as a first redistribution layer in that the conductive elements act to provide an electrical connection to the through-substrate vias and to provide redistribution lines. Accordingly, the first conductive elements 710 along the left side that are generally located over the through-substrate vias 124 may, if desirable, extend into or out of the page to provide a different pin-out configuration than provided for by the through-substrate vias 124 for a particular application. The first conductive element 710 on the right side represents one of those redistribution lines that extend into or out of the page where it is connected to a through-substrate via, which may or may not include one of the through-substrate vias shown in the figures. In this manner, pin-out configurations different than the locations of the through-substrate vias may be provided, providing for additional flexibility in the design of the semiconductor device.

The etch process may be, for example, a wet or dry etch process. For example, in an embodiment in which the first conductive layer 510 is formed of Al, the etch process may be performed using $Cl_2$ and $BCl_3$.

After the etching process, the photoresist may be stripped by, for example, an ashing process, such as a plasma ashing process using $O_2$ or another stripping process, and a cleaning process, such as a wet dip in dilute hydrofluoric acid or an organic chemical (e.g., EKC or ST250), may be performed to remove any contaminants from the surface of the first conductive elements 710 and the first isolation film 310.

Figure 8:
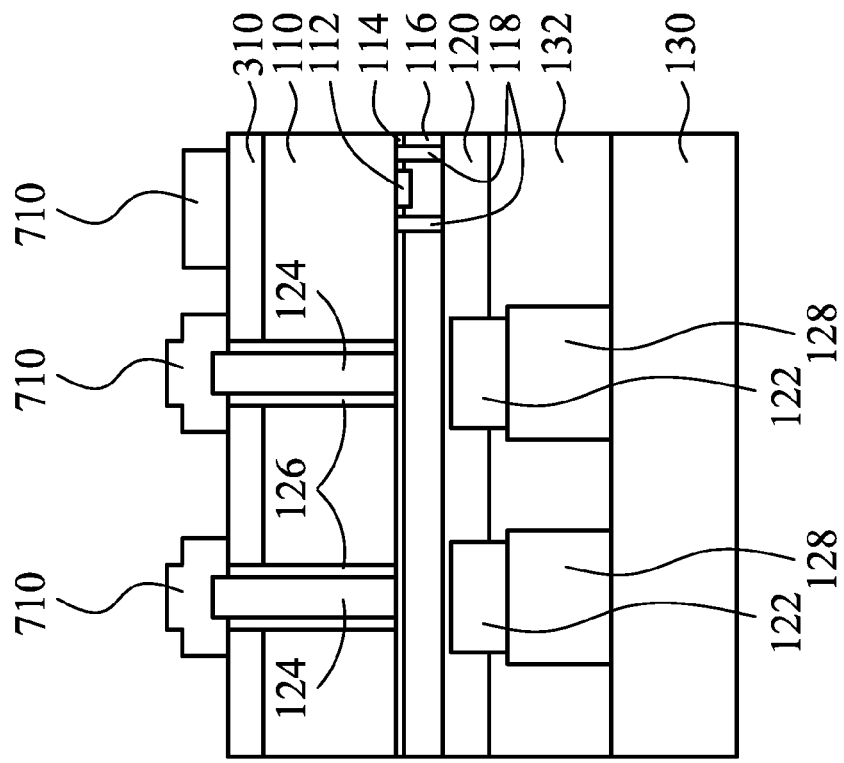

FIG. 8 illustrates a second isolation film 810 formed over the backside of the semiconductor substrate 110 in accordance with an embodiment. The second isolation film 810 is a dielectric material, such as SiN, an oxide, SiC, SiON, a polymer, SOG, combinations thereof, or the like, and may be formed by, for example, spin-coating, printing, a CVD process, or the like. In an embodiment, the second isolation film 810 is formed using a low-temperature process, e.g., using temperatures less than 250° C. by a PECVD process, preventing the bonding adhesive from degrading to ensure the mechanical strength throughout the integration process. In an embodiment, the second isolation film 810 is formed having a thickness sufficient to cover the first conductive elements 710 as illustrated in FIG. 8.

Depending on the process utilized to form the second isolation film 810, it may be desirable to perform a planarization process. In particular, some methods of deposition, such as spin-coating, create a planar surface, but other methods, such as a CVD process, form a conformal layer, and as a result, it may be desirable to perform a planarization process, such as a grinding or CMP process, to create a planar surface as illustrated in FIG. 8. However, it should be noted that if a self-planarizing process is used that forms a substantially planar surface such as spin-coating, the added expense of performing a separate planarizing process such as a CMP may be avoided.

Figure 9:
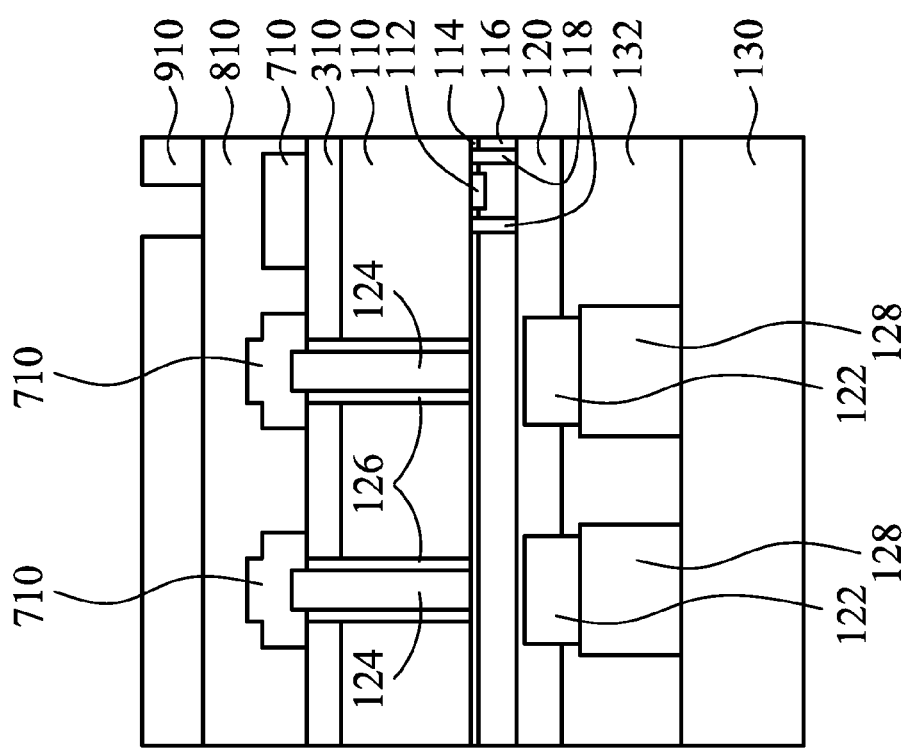

FIG. 9 illustrates a second patterned mask 910 formed over the second isolation film 810 in accordance with an embodiment. The second patterned mask 910 defines the contacts that are to be formed through the second isolation film 810 to the first conductive elements 710 as discussed in greater detail below. The second patterned mask 910 may be a patterned photoresist mask, hard mask, a composite layer, combinations thereof, or the like. In an embodiment, a photoresist material is deposited to a thickness of about sub-μms to about several μms and patterned.

Figure 10:
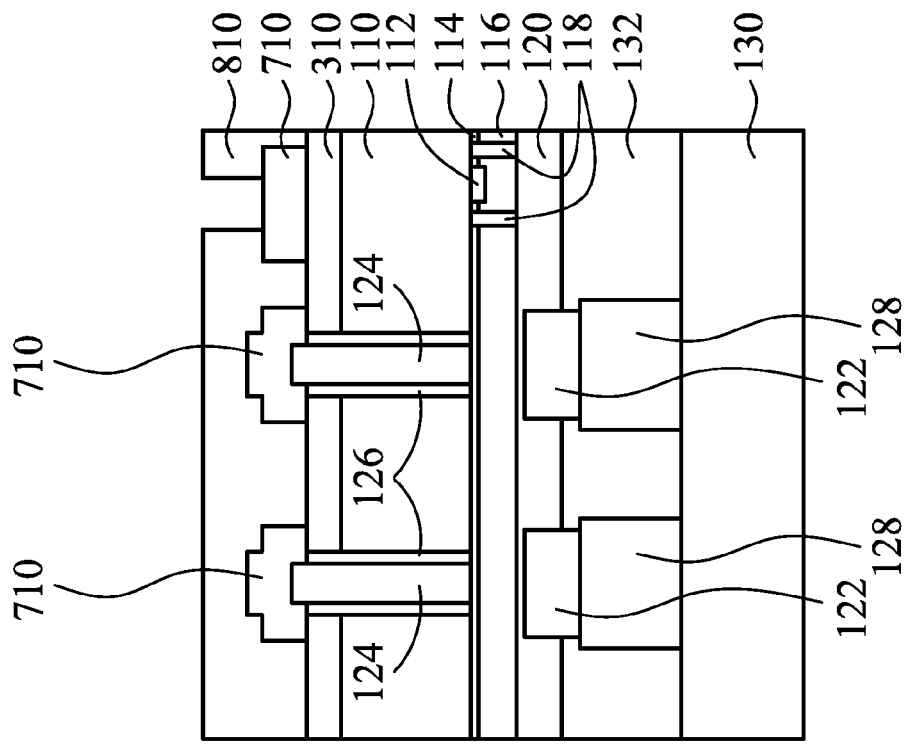

Thereafter, in FIG. 10, an etch process is performed to pattern the second isolation film 810 to form contact openings to the first conductive elements 710, which act as the conductive pads and redistribution lines. The etch process may be, for example, a wet or dry etch process. In an embodiment in which the second isolation film 810 is formed of silicon dioxide, the second isolation film 810 may be etched by a dry etch process using $CF_4$, $CHF_3$, $CH_2F_2$, $C_4F_8$, Ar, and/or $O_2$. Other processes and materials may be used.

After the etching process, the photoresist may be stripped by, for example, an ashing process, such as a plasma ashing process using $O_2$ or another stripping process, and a cleaning process, such as a wet dip in dilute hydrofluoric acid or an organic chemical (e.g., EKC or ST250), may be performed to remove any contaminants from the surface of the second isolation film 810 and the first conductive elements 710.

Figure 11:
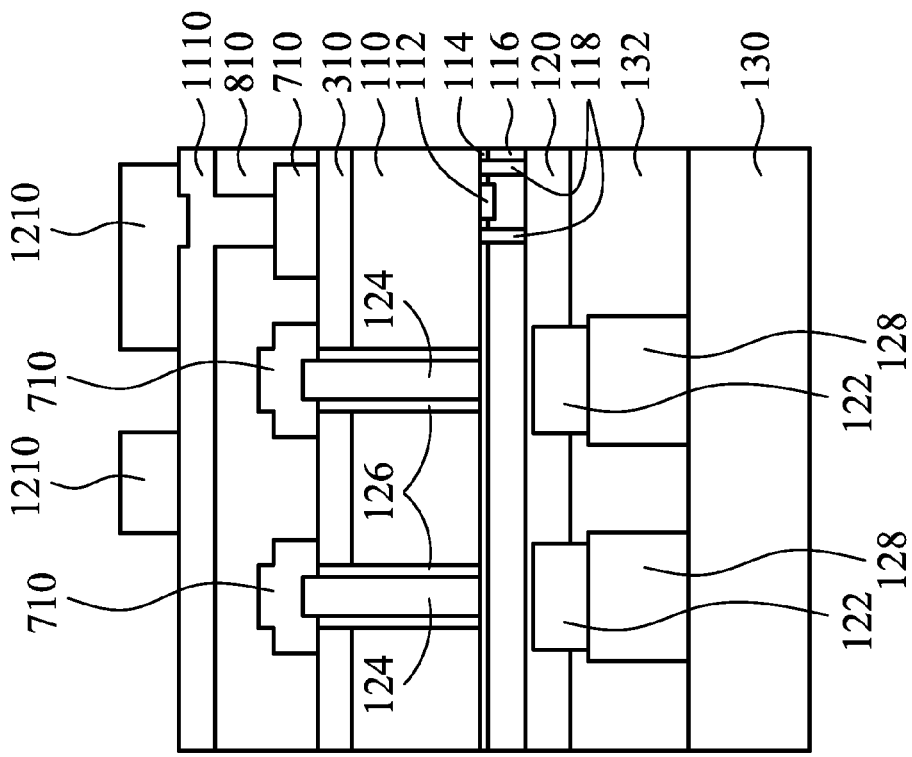

Referring now to FIG. 11, a second conductive layer 1110 is deposited over the surface of the second isolation film 810 and the exposed portions of the first conductive elements 710. In an embodiment, the second conductive layer 1110 may be formed by depositing a conformal conductive layer, such as a layer of Al, an Al alloy, W, Cu, Ti, Ta, TiN, TaN, or the like, using CVD or PVD techniques.

One of ordinary skill in the art will realize that FIG. 11 illustrates only that an electrical connection is made only to the first conductive element 710 on the right. In an embodiment, the electrical connections to the two first conductive elements 710 on the left are made to the respective redistribution lines coupled to the two first conductive elements 710 on the left running into and/or out of the page in the same manner that the electrical connection of the first conductive element 710 on the right may form an electrical connection to a through-substrate via not shown in this particular cross-section. Although, it may be desirable for a first conductive element to be formed directly overlying a through-substrate via.

Figure 12:
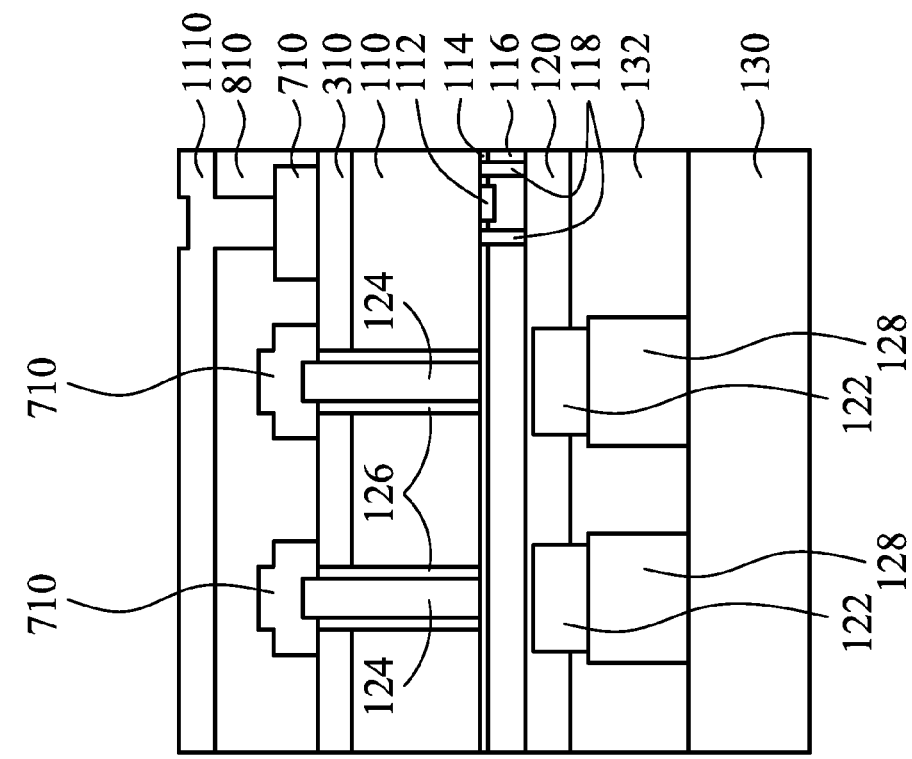

FIG. 12 illustrates a third patterned mask 1210 formed over the second conductive layer 1110 in accordance with an embodiment. The third patterned mask 1210 will protect portions of the second conductive layer 1110 that will act as conductive pads and redistribution lines in a second redistribution layer as discussed in greater detail below. The third patterned mask 1210 may be a patterned photoresist mask, hard mask, composite layer, or the like. In an embodiment, a photoresist material is deposited to a thickness of about sub-µms to about several µms and patterned.

Figure 13:
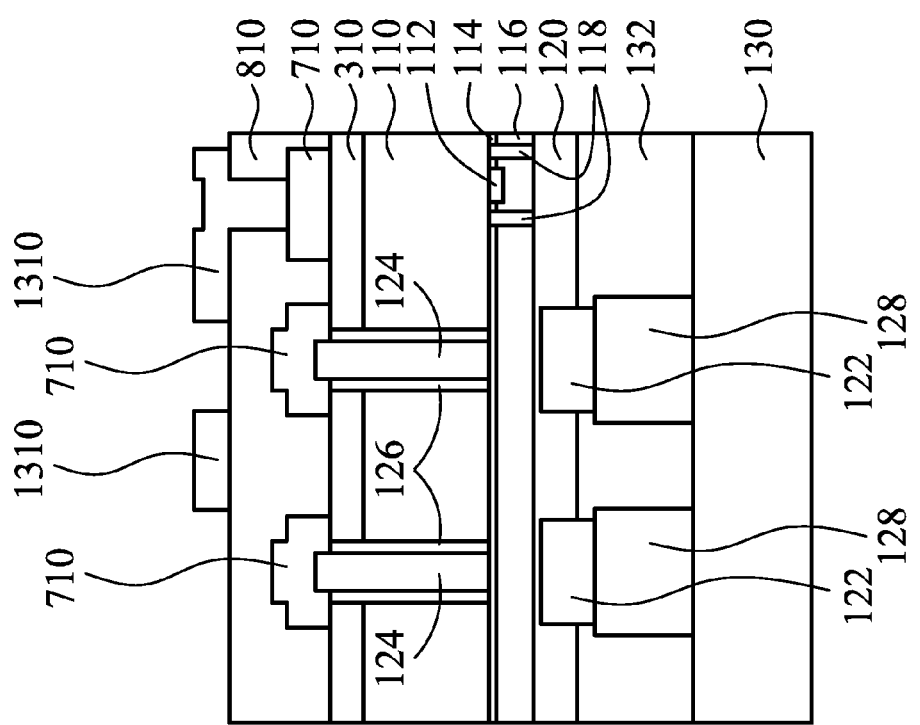

Thereafter, in FIG. 13, an etch process is performed to pattern the second conductive layer 1110 to form second conductive elements 1310 that act as the conductive pads and redistribution lines in the second redistribution layer. The etch process may be, for example, a wet or dry etch process. After the etching process, the photoresist may be stripped by, for example, an ashing process, such as a plasma ashing process using $O_2$ or another stripping process, and a cleaning process, such as a wet dip in dilute hydrofluoric acid or an organic chemical (e.g., EKC or ST250), may be performed to remove any contaminants from the surface of the second isolation film 810 and the second conductive elements 1310.

FIG. 13 illustrates two second conductive elements 1310. The second conductive element 1310 shown on the left extends into and out of the page, where it may be electrically connected to a respective first conductive element 710, which is electrically connected to a respective through-substrate via 124.

Figure 14:
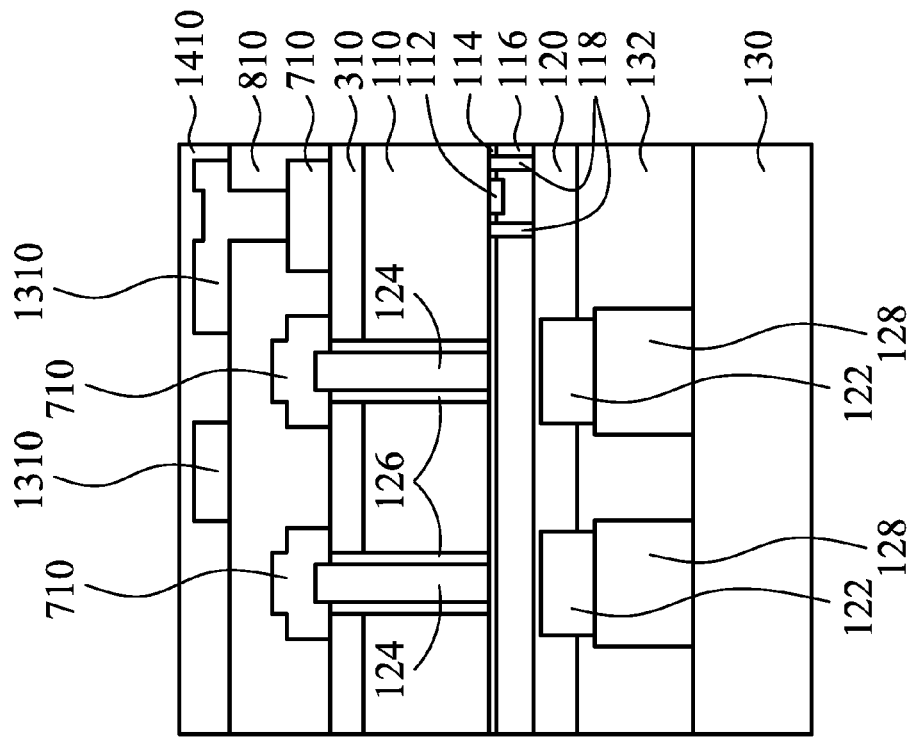

FIG. 14 illustrates a third isolation film 1410 in accordance with an embodiment. The third isolation film 1410 is a dielectric material, such as SiN, an oxide, SiC, SiON, a polymer, SOG, combinations thereof, or the like, and may be formed by, for example, spin-coating, printing, a CVD process, or the like. In an embodiment, the second isolation film 810 is formed using a low-temperature process, e.g., using temperatures less than 250° C. by a PECVD process, preventing the bonding adhesive from degrading to ensure the mechanical strength throughout the integration process. In an embodiment, the third isolation film 1410 is formed having a thickness sufficient to cover the second conductive elements 1310.

Depending on the process utilized to form the third isolation film 1410, it may be desirable to perform a planarization process. In particular, some methods of deposition, such as spin-coating, create a planar surface, but other methods, such as a CVD process, form a conformal layer, and as a result, it may be desirable to perform a planarization process, such as a grinding or CMP process, to create a planar surface as illustrated in FIG. 14. However, it should be noted that if a self-planarizing process is used that forms a substantially planar surface such as spin-coating, the added expense of performing a separate planarizing process such as a CMP may be avoided.

Figure 15:
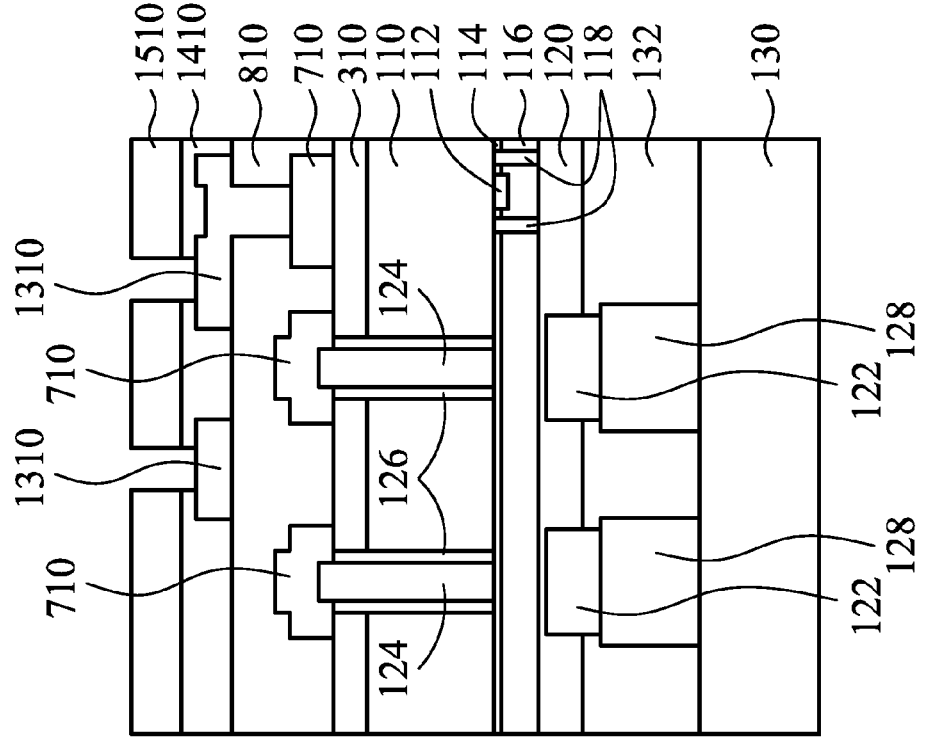

FIG. 15 illustrates a fourth patterned mask 1510 formed over the third isolation film 1410 in accordance with an embodiment. The fourth patterned mask 1510 defines the area of the second conductive elements 1310 that are to be exposed, on which conductive bumps will be formed as discussed in greater detail below. The fourth patterned mask 1510 may be a patterned photoresist mask, hard mask, composite layer, or the like. In an embodiment, a photoresist material is deposited to a thickness of about sub-µms to about several µms and patterned.

Thereafter, an etch process is performed to pattern the third isolation film 1410 to expose portions of the second conductive elements 1310 on which conductive bumps are to be formed. The etch process may be, for example, a wet or dry etch process. After the etching process, the photoresist may be stripped by, for example, an ashing process and a cleaning process may be performed to remove any contaminants from the surface of the second conductive elements 1310 and the third isolation film 1410.

Figure 16:
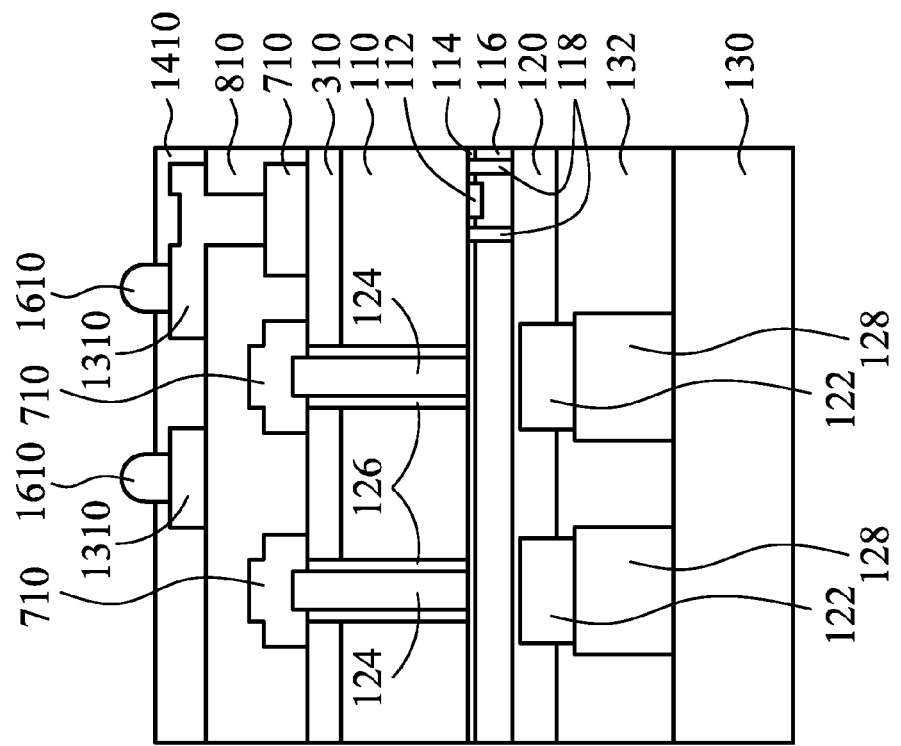

As illustrated in FIG. 16, connection elements 1610 are formed on the exposed portions of the second conductive elements 1310 in accordance with an embodiment. The connection elements 1610 may be any suitable conductive material, such as Cu, Ni, Sn, Au, Ag, or the like, and may be formed by any suitable method, including evaporation, electroplating, printing, jetting, stud bumping, direct placement, or the like.

Thereafter, other back-end-of-line (BEOL) processing techniques suitable for the particular application may be performed. For example, the carrier substrate 130 may be removed, an encapsulant may be formed, a singulation process may be performed to singulate individual dies, wafer-level or die-level stacking, and the like, may be performed. It should be noted, however, that embodiments may be used in many different situations. For example, embodiments may be used in a die-to-die bonding configuration, a die-to-wafer bonding configuration, or a wafer-to-wafer bonding configuration.

FIGS. 17-24 illustrate the intermediate stages of another method for forming a die having a multi-layer interconnect structure and/or a redistribution layer suitable for use in a 3D IC or stacked die configuration. This embodiment is similar to the embodiment discussed above, but utilizes a conductive seed layer process as opposed to forming a single layer of conductive material.

Accordingly, this second method begins with processes similar to those discussed above with reference to FIGS. 1-4. Thereafter, as illustrated in FIG. 17, a conformal first seed layer 1710 is deposited over the surface of the first isolation film 310 and the exposed portions of the through-substrate vias 124. The first seed layer 1710 is a thin layer of a conductive material that aids in the formation of a thicker layer during subsequent processing steps. In an embodiment, the first seed layer 1710 may be formed by depositing a thin conductive layer, such as a thin layer of Cu, Ti, Ta, TiN, TaN, or the like, using CVD or PVD techniques. For example, a layer of Ti is deposited by a PVD process to form a barrier film and a layer of Cu is deposited by a PVD process to form a seed layer.

FIG. 18 illustrates a first patterned mask 1810 formed over the first seed layer 1710 in accordance with an embodiment. The first patterned mask 1810 will act as a mold for forming conductive pads and redistribution lines of a first redistribution layer in subsequent processing steps. The first patterned mask 1810 may be a patterned photoresist mask, hard mask, composite layer, combinations thereof, or the like. In an embodiment, a photoresist material is deposited to a thickness of about sub-μms to about several μms and patterned to form openings as illustrated in FIG. 18.

It should be noted that the embodiment illustrated in FIG. 18 utilizes square openings for illustrative purposes only. In other embodiments, a re-entrant profile, such that the openings are wider along the bottom of the openings along the first seed layer 1710 than the top portion of the openings, may also be used. In yet other embodiments, a profile such that the openings are wider along the upper surface of the first patterned mask 1810 as compared to the openings along the surface of the first seed layer 1710 may be used.

Figure 19:
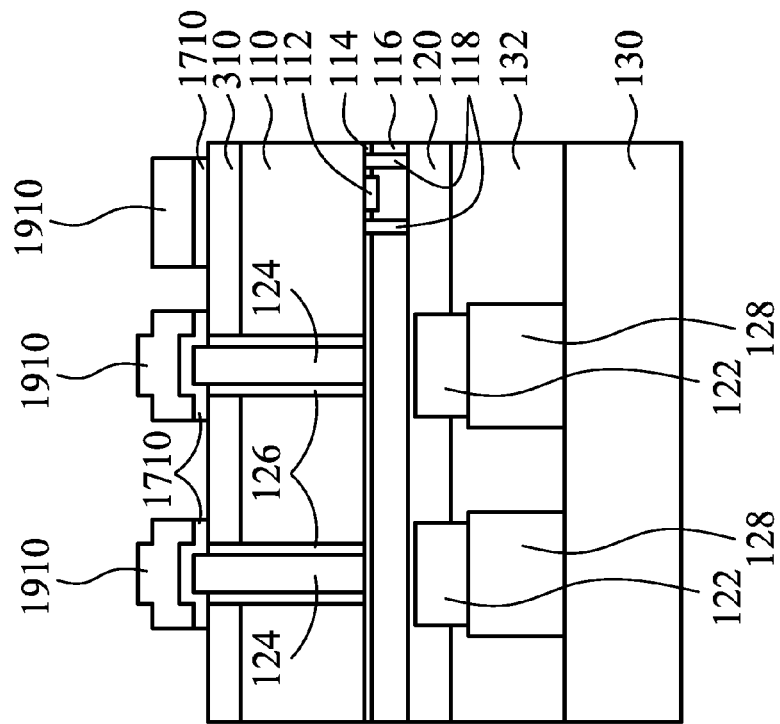

Thereafter, first conductive elements 1910 are formed in the openings of the first patterned mask 1810 as illustrated in FIG. 19. The first conductive elements 1910 may be metal, such as copper, tungsten, or other conductive metal, and may be formed, for example, by electroplating, electroless plating, or the like. In an embodiment, an electroplating process is used wherein the wafer is submerged or immersed in the electroplating solution. The wafer surface is electrically connected to the negative side of an external DC power supply such that the wafer functions as the cathode in the electroplating process. A solid conductive anode, such as a copper anode, is also immersed in the solution and is attached to the positive side of the power supply. The atoms from the anode are dissolved into the solution, from which the cathode, e.g., the wafer, acquires, thereby plating the exposed conductive areas of the wafer, e.g., exposed portions of the first seed layer 1710 within the openings of the first patterned mask 1810.

Figure 20:
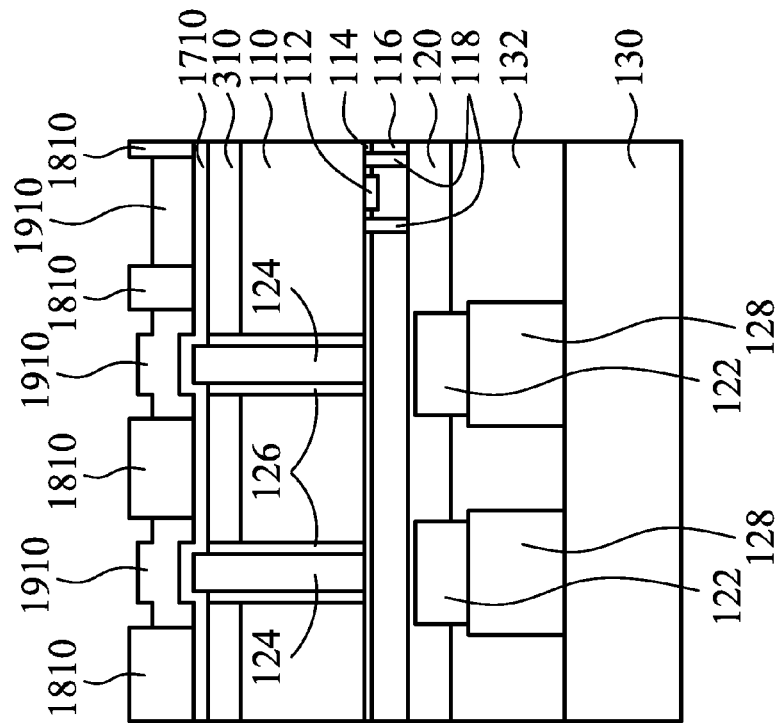

FIG. 20 illustrates the removal of the first patterned mask 1810 (see FIGS. 18 and 19) in accordance with an embodiment. In an embodiment in which the first patterned mask 1810 is a photoresist mask, a plasma ashing or wet strip process may be used to remove the first patterned mask 1810. One suitable ashing process comprises a plasma ashing process using $O_2$.

FIG. 20 also illustrates removal of the exposed portions of the first seed layer 1710. Exposed portions of the first seed layer 1710 may be removed by, for example, a wet etching process. Optionally, a cleaning process, such as a wet dip in dilute hydrofluoric acid or an organic chemical (e.g., EKC or ST250), may be performed to clean the wafer and remove remaining photoresist material and seed layer.

Figure 21:
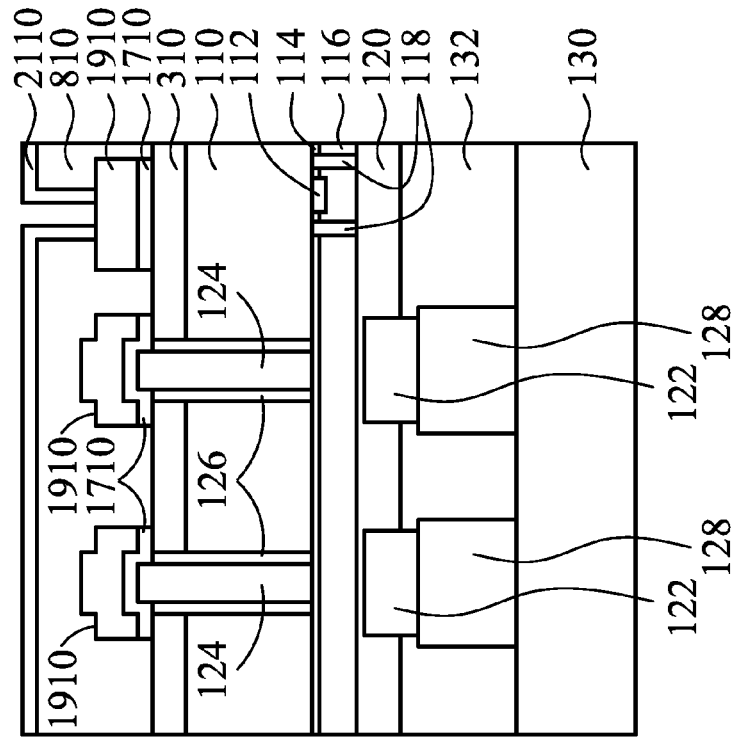

FIG. 21 illustrates the structure of FIG. 20 after forming and patterning the second isolation film 810. The second isolation film 810 may be formed using materials and processes similar to those discussed above with reference to FIGS. 8-10.

FIG. 21 also shows formation of a second seed layer 2110 in accordance with an embodiment. The second seed layer 2110 may be formed using similar processes and materials as those used to form the first seed layer 1710 discussed above with reference to FIG. 17.

Figure 22:
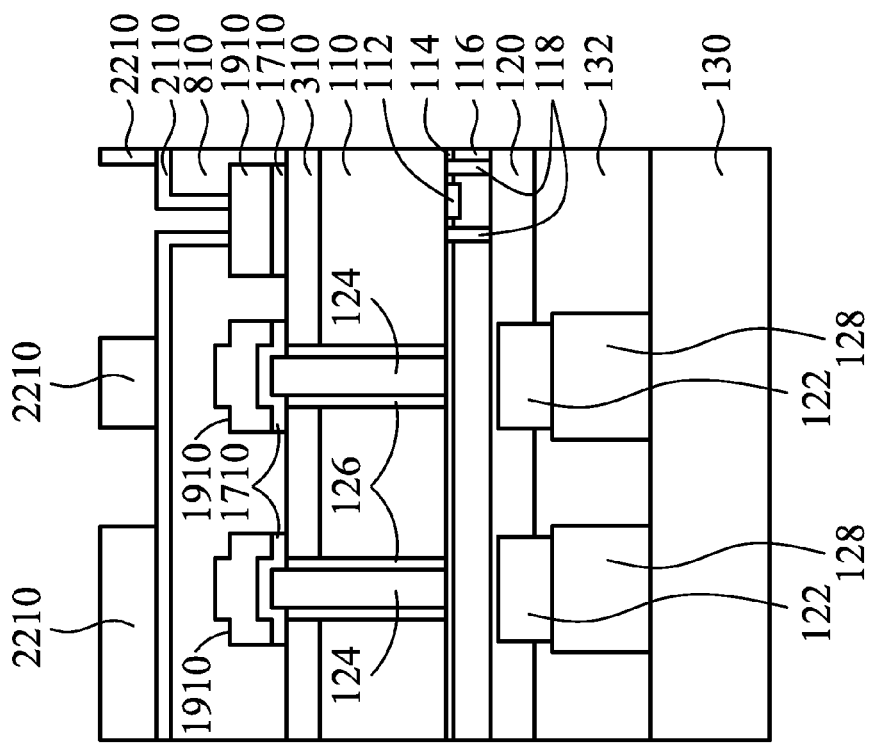

FIG. 22 illustrates a second patterned mask 2210 formed over the second seed layer 2110 in accordance with an embodiment. The second patterned mask 2210 will act as a mold for forming conductive pads and redistribution lines in subsequent processing steps in a similar manner as discussed above with reference to FIG. 18. The second patterned mask 2210 may be a patterned photoresist mask, hard mask, composite layer, combination thereof, or the like. In an embodiment, a photoresist material is deposited to a thickness of about sub-μms to about several μms and patterned to form openings as illustrated in FIG. 22.

Figure 23:
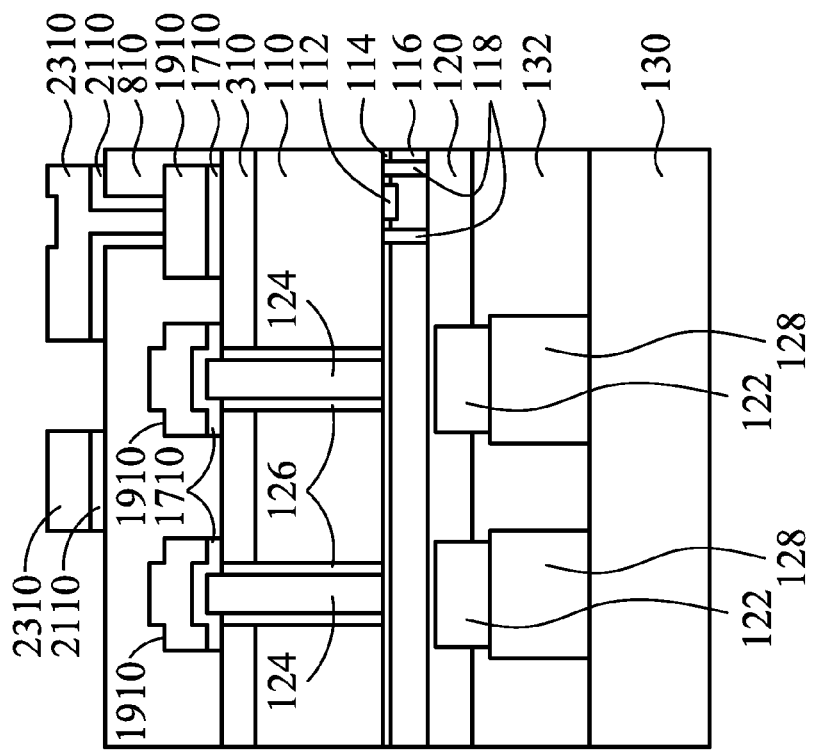

Thereafter, second conductive elements 2310 are formed in the openings of the second patterned mask 2210 as illustrated in FIG. 23. The second conductive elements 2310 may be any suitable conductive material, including metal, such as copper, tungsten, or other conductive metal, and may be formed, for example, by electroplating, electroless plating, or the like. In an embodiment, the second conductive elements 2310 are formed using similar processes and materials as those discussed above with reference to FIG. 19.

Figure 24:
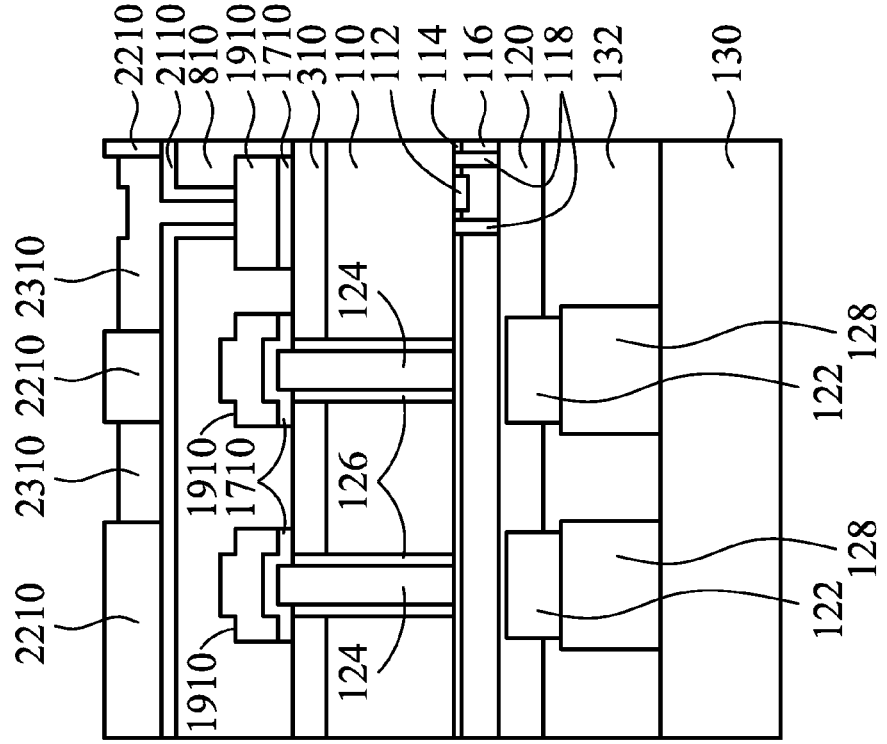

The second patterned mask 2210 and the remaining portions of the second seed layer 2110 may be removed as illustrated in FIG. 24. The second patterned mask 2210 and the second seed layer 2110 may be removed using processes and materials similar to those discussed above with reference to FIG. 20.

Figure 25:
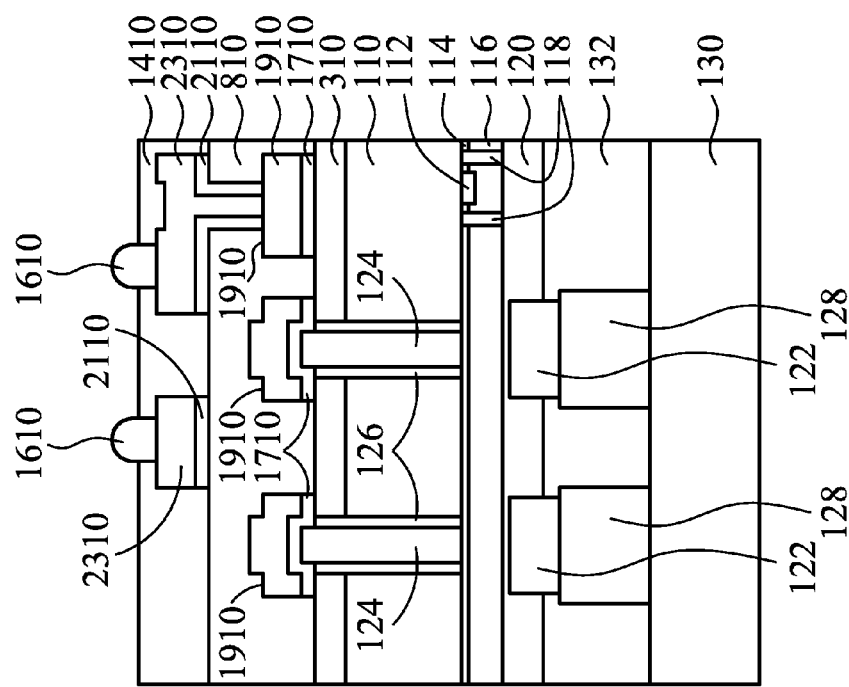

Thereafter, processes and materials similar to those discussed above with reference to FIGS. 14-16 may be used to form and pattern the third isolation film 1410 and connection elements 1610 as illustrated in FIG. 25, as well as other BEOL processes.

Figure 26:
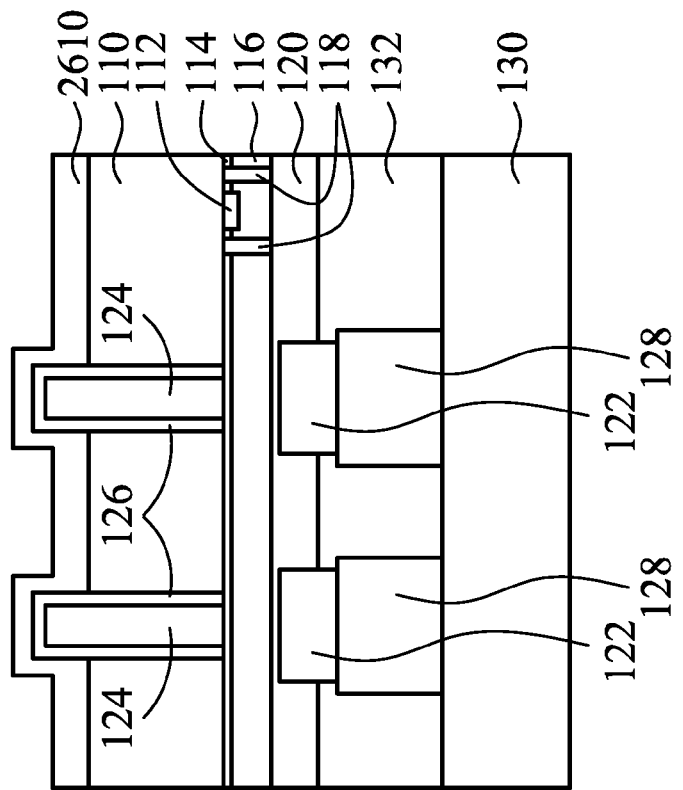

FIGS. 26-35 illustrate the intermediate stages of another method for forming a die having an interconnect structure and/or a redistribution layer suitable for use in a 3D IC or stacked die configuration. This embodiment begins with processes similar to those discussed above with reference to FIGS. 1-2. Thereafter, as illustrated in FIG. 26, a first isolation film 2610 is formed. The first isolation film 2610 is a conformal film formed using similar processes and materials as the first isolation film 310 discussed above with reference to FIG. 3, except where the first isolation film 310 of FIG. 3 has a thickness greater than the exposed portions of the through-substrate vias 124, the first isolation film 2610 of FIG. 26 has a thickness less than the height of the exposed portions of the through-substrate vias 124. For example, in an embodiment in which the through-substrate vias 124 protrude about 2 μm to about 3 μm from the backside of the substrate 110, the first isolation film 2610 has a thickness from about 1 μm to about 1.5 μm.

Figure 27:
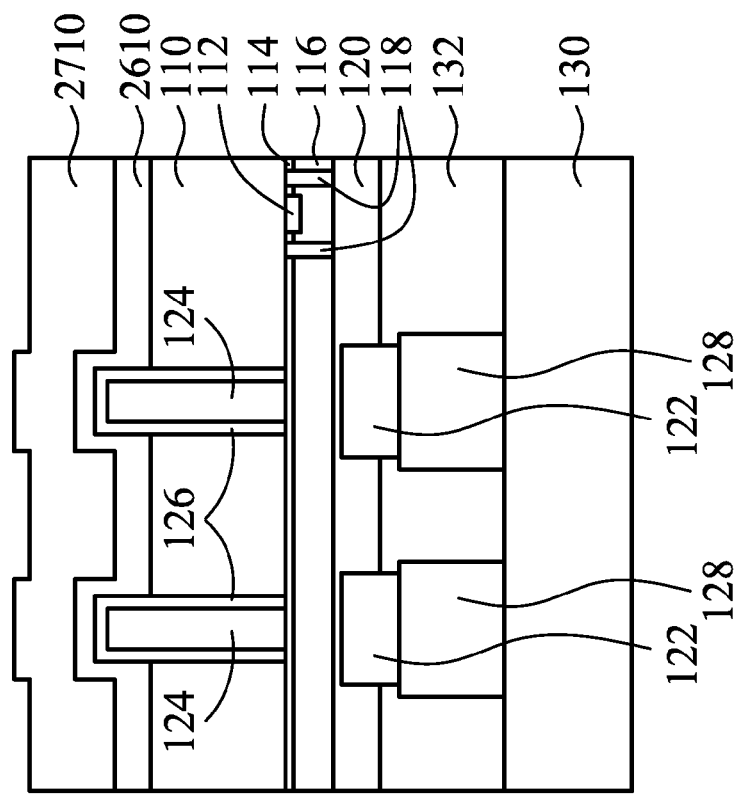

FIG. 27 illustrates the structure of FIG. 26 after a first masking layer 2710 has been formed over the first isolation film 2610. The first masking layer 2710 may be formed of a photoresist material using similar processes and materials as those used to form the first patterned mask 610 discussed above with reference to FIG. 6.

Figure 28:
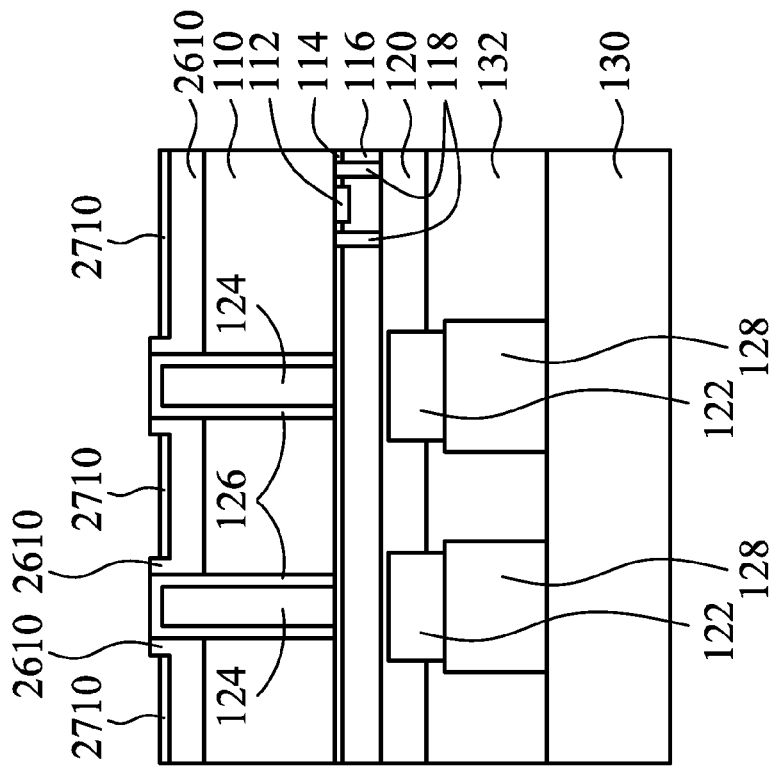

Thereafter, as illustrated in FIG. 28, an etch-back process is performed to thin the first masking layer 2710 and expose the first isolation film 2610 over the through-substrate vias 124. In an embodiment in which a photoresist material is used as the first masking layer 2710, the etch-back process may be performed by, for example, using an $O_2$ plasma dry etching process.

Figure 29:
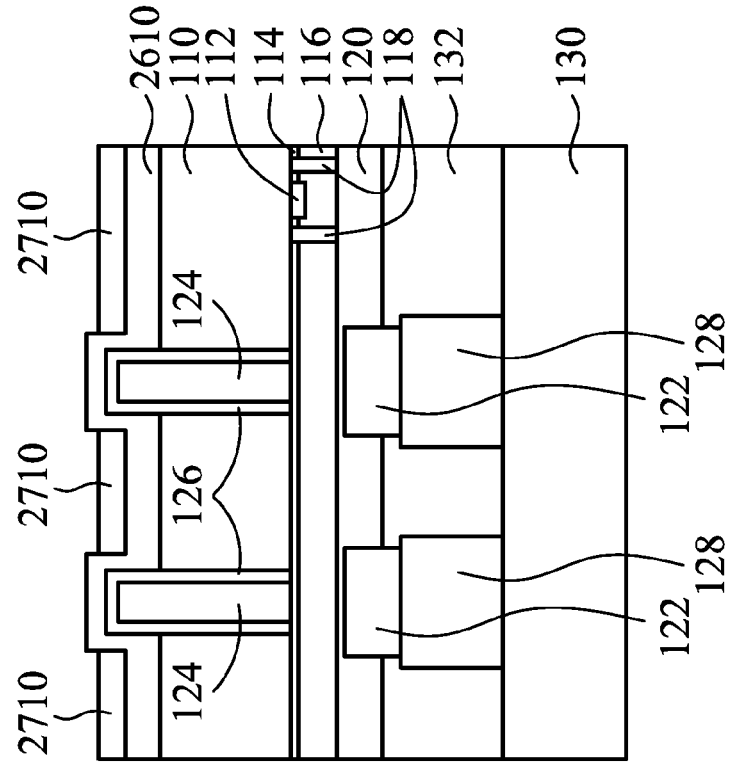

After the first masking layer 2710 is exposed over the through-substrate vias 124, the first isolation film 2610 located over the through-substrate vias 124 is removed, thereby exposing the liner 126, as illustrated in FIG. 29. In an embodiment in which the first isolation film 2610 is formed of silicon dioxide, the first isolation film 2610 may be recessed by performing a wet etch using hydrofluoric acid or a dry etching process using $CF_4$, $CHF_3$, $CH_2F_2$, $C_4F_8$, Ar, and/or $O_2$. Other processes and materials may be used.

Figure 30:
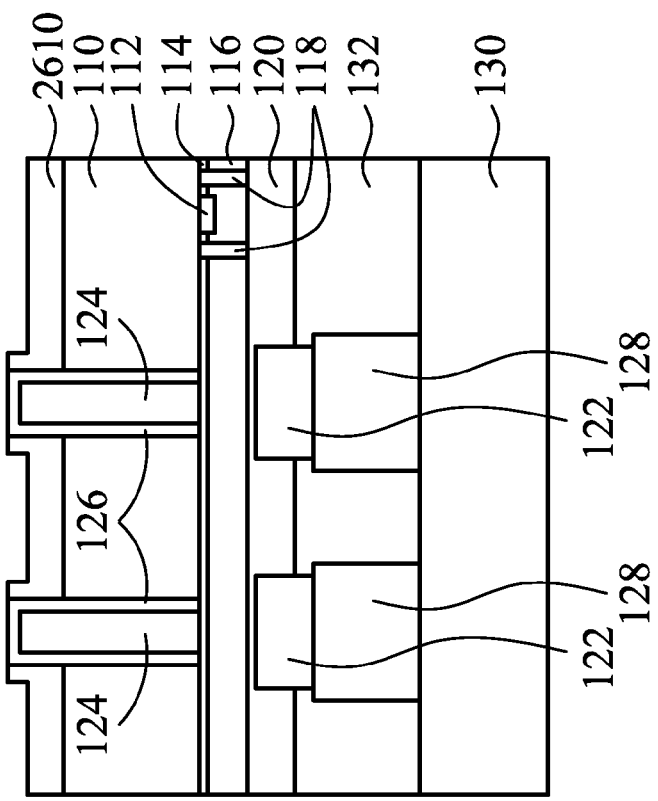

Referring now to FIG. 30, after the etching process, the photoresist may be stripped by, for example, an ashing process, such as a plasma ashing process using $O_2$ or another stripping process.

Figure 31:
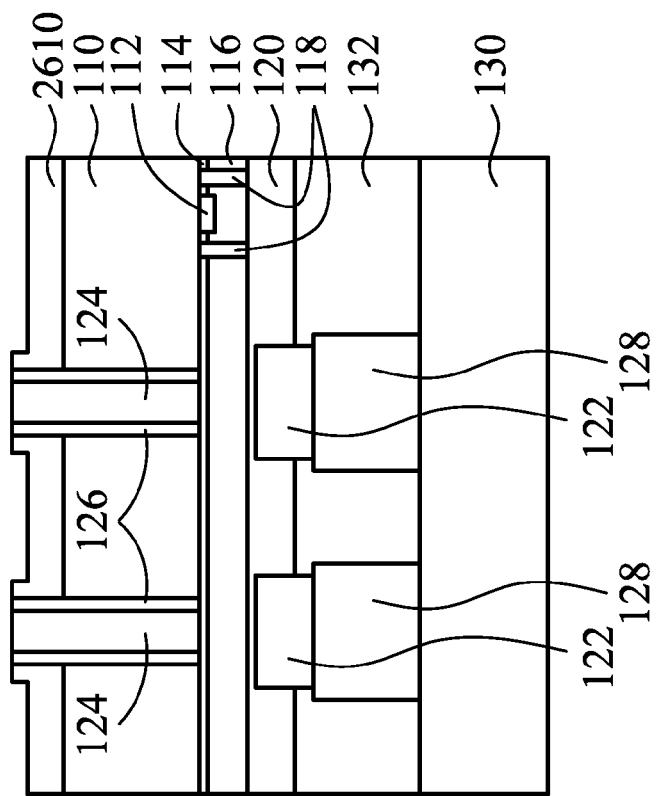

After stripping the photoresist, FIG. 31 illustrates the removal of the liner 126 covering the through-substrate vias 124, thereby exposing the through-substrate via 124. In an embodiment, the liner 126, which may be formed using PECVD processes, may be removed by, for example, performing a dry etching process using $CF_4$, $CHF_3$, $CH_2F_2$, $C_4F_8$, Ar, and/or $O_2$, dependent upon the type of material used to form the liner 126. Other processes and materials may be used.

Referring now to FIG. 32, a first conductive layer 3210 is deposited over the surface of the first isolation film 2610 and the exposed portions of the through-substrate vias 124. In an embodiment, the first conductive layer 3210 may be formed by depositing a conformal conductive layer, such as a layer of Al, an Al alloy, W, Cu, Ti, Ta, TiN, TaN, or the like, using CVD or PVD techniques.

FIG. 33 illustrates a first patterned mask 3310 formed over the first conductive layer 3210 in accordance with an embodiment. The first patterned mask 3310 will protect portions of the first conductive layer 3210 that will act as conductive pads and redistribution lines as discussed in greater detail below. The first patterned mask 3310 may be a patterned photoresist mask, hard mask, combinations thereof, or the like. In an embodiment, a photoresist material is deposited to a thickness of about sub-μms to about several μms and patterned. The first patterned mask 3310 may also be a composite layer.

Figure 34:
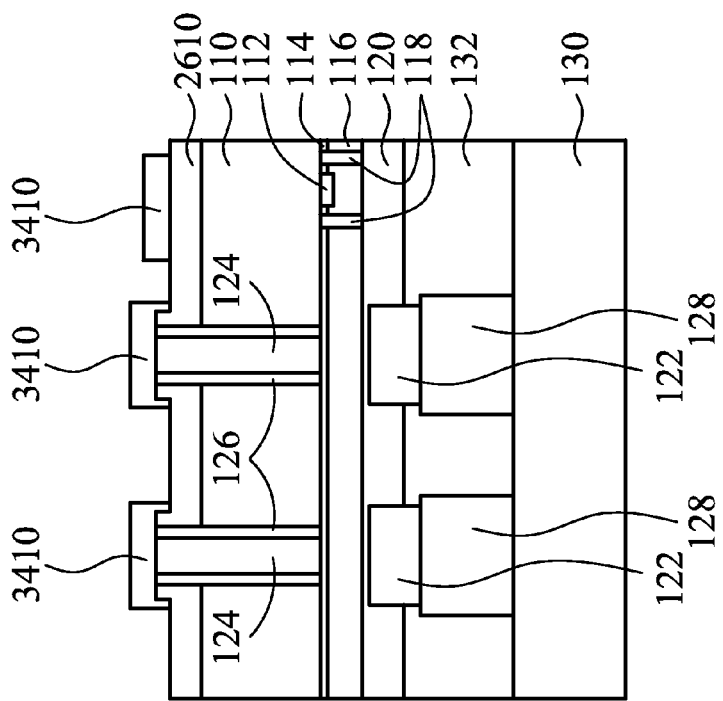

Thereafter, in FIG. 34, an etch process is performed to pattern the first conductive layer 3210 to form first conductive elements 3410 that act as the conductive pads and redistribution lines. As one of ordinary skill in the art will realize, FIG. 34 illustrates two first conductive elements 3410 along the left side generally overlying the through-substrate vias 124, and another first conductive element 3410 along the right side, which conductive element does not directly overlie a through-substrate via. The first conductive elements 3410 act as a first redistribution layer in that the conductive elements act to provide an electrical connection to the through-substrate vias and to provide redistribution lines. Accordingly, the first conductive elements 3410 along the left side that are generally located over the through-substrate vias 124 may extend into or out of the page as desirable for a particular application. The first conductive element 3410 on the right side represents one of those redistribution lines that extend into or out of the page where it is connected to a through-substrate via. In this manner, pin-out configurations different than the locations of the through-substrate vias may be provided, providing for additional flexibility in the design of the semiconductor device.

The etch process may be, for example, a wet or dry etch process. After the etching process, the photoresist may be stripped by, for example, an ashing process, such as a plasma ashing process using $O_2$ or another stripping process, and a cleaning process, such as a wet dip in dilute hydrofluoric acid or an organic chemical (e.g., EKC or ST250), may be performed to remove any contaminants from the surface of the first conductive elements 3410 and the first isolation film 2610.

Figure 35:
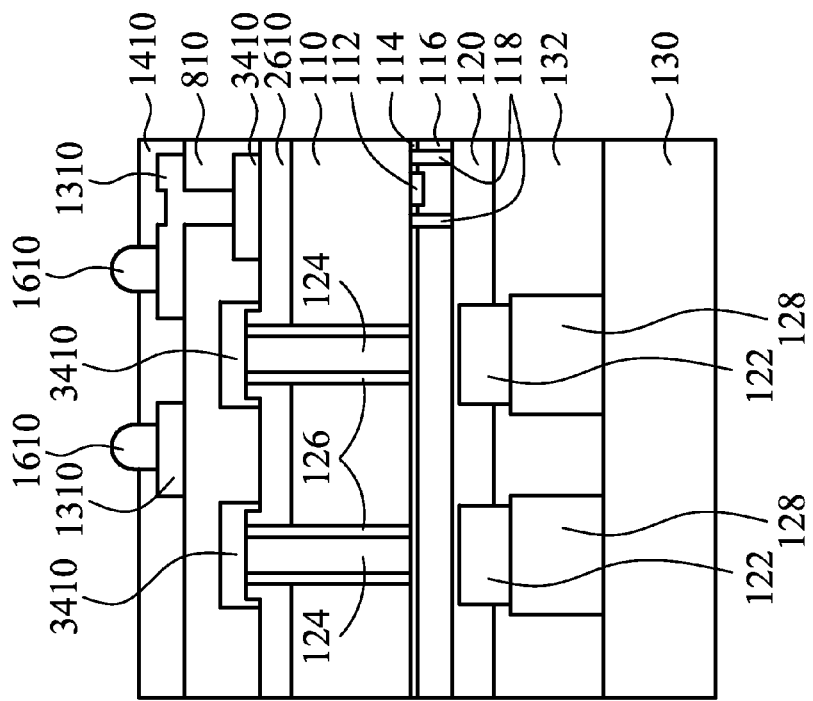

FIG. 35 illustrates the structure of FIG. 34 after the second isolation film 810, the second conductive elements 1310, the third isolation film 1410, and the connection elements 1610 are formed. The second isolation film 810, the second conductive elements 1310, the third isolation film 1410, and the connection elements 1610 may be formed as discussed above with reference to FIGS. 8-16.

Thereafter, other BEOL processing techniques suitable for the particular application may be performed. For example, the carrier substrate 130 may be removed, an encapsulant may be formed, a singulation process may be performed to singulate individual dies, wafer-level or die-level stacking, and the like, may be performed. It should be noted, however, that embodiments may be used in many different situations. For example, embodiments may be used in a die-to-die bonding configuration, a die-to-wafer bonding configuration, or a wafer-to-wafer bonding configuration.

FIGS. 36-40 illustrate the intermediate stages of yet another embodiment for forming a die having an interconnect structure and/or a redistribution layer suitable for use in a 3D IC or stacked die configuration. This embodiment is similar to the embodiment discussed above with reference to FIGS. 26-35, but utilizes a conductive seed layer process as opposed to forming a single layer of conductive material.

Figure 36:
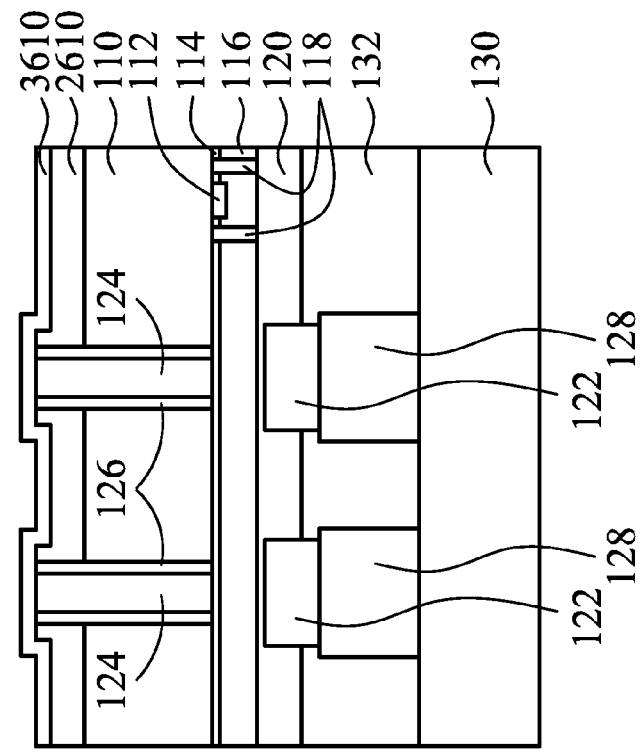

Accordingly, this embodiment begins with processes similar to those discussed above with reference to FIGS. 1-2 followed by the processes discussed above with reference to FIGS. 26-31. Thereafter, as illustrated in FIG. 36, a conformal first seed layer 3610 is deposited over the surface of the first isolation film 2610 and the exposed portions of the through-substrate vias 124. The first seed layer 3610 is a thin layer of a conductive material that aids in the formation of a thicker layer during subsequent processing steps. In an embodiment, the first seed layer 3610 may be formed by depositing a thin conductive layer, such as a thin layer of Cu, Ti, Ta, TiN, TaN, or the like, using CVD or PVD techniques. For example, a layer of Ti is deposited by a PVD process to form a barrier film and a layer of Cu is deposited by a PVD process to form a seed layer.

Figure 37:
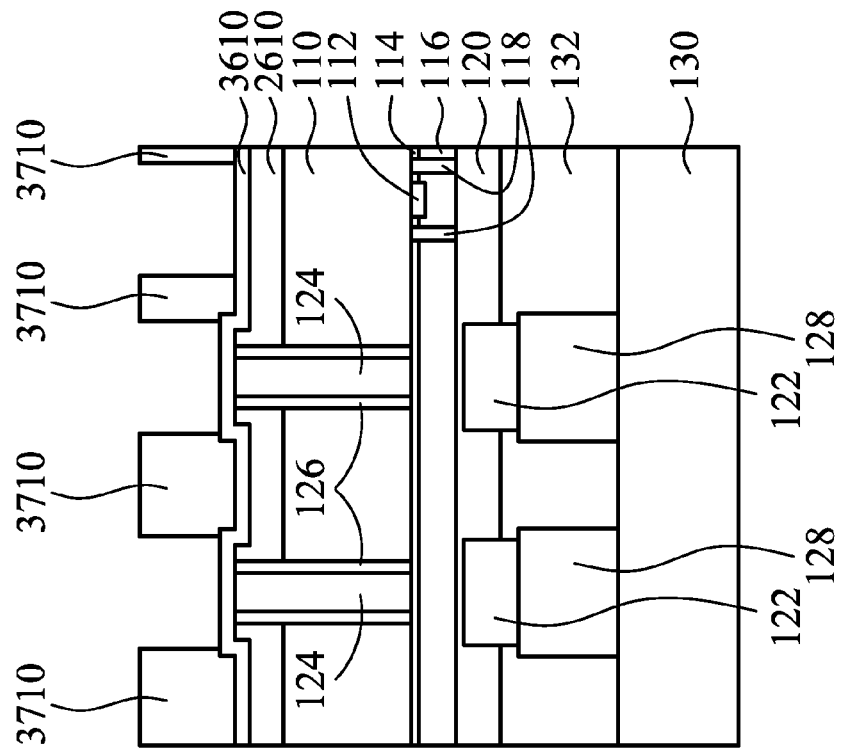
FIGS. 36-40 illustrate still another embodiment in which a multi-layer interconnect structure is provided.

FIG. 37 illustrates a first patterned mask 3710 formed over the first seed layer 3610 in accordance with an embodiment. The first patterned mask 3710 will act as a mold for forming conductive pads and redistribution lines in subsequent processing steps. The first patterned mask 3710 may be a patterned photoresist mask, hard mask, composite layer, combinations thereof, or the like. In an embodiment, a photoresist material is deposited to a thickness of about several μms and patterned to form openings as illustrated in FIG. 37.

It should be noted that the embodiment illustrated in FIG. 37 utilizes square openings for illustrative purposes only. In other embodiments, a re-entrant profile such that the openings are wider along the bottom of the openings along the first seed layer 3610 than the top portion of the openings may also be used. In yet other embodiments, a profile such that the openings are wider along the upper surface of the first patterned mask 3710 as compared to the openings along the surface of the first seed layer 3610 may be used.

Figure 38:
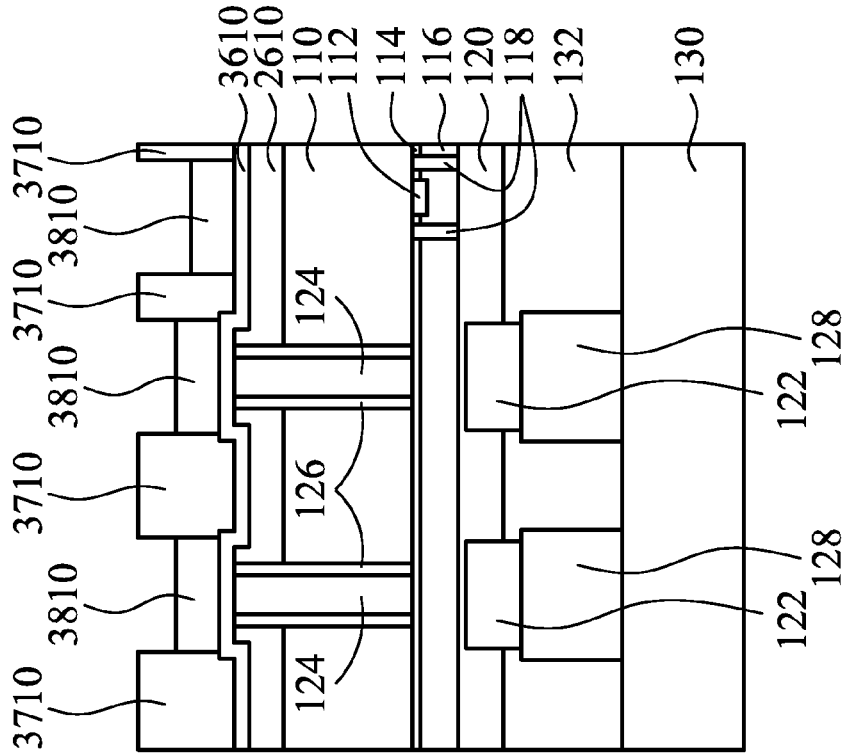

Thereafter, first conductive elements 3810 are formed in the openings of the first patterned mask 3710 as illustrated in FIG. 38. The first conductive elements 3810 may be metal, such as copper, tungsten, or other conductive metal, and may be formed, for example, by electroplating, electroless plating, or the like. In an embodiment, an electroplating process is used such as that described above with reference to FIG. 19.

Figure 39:
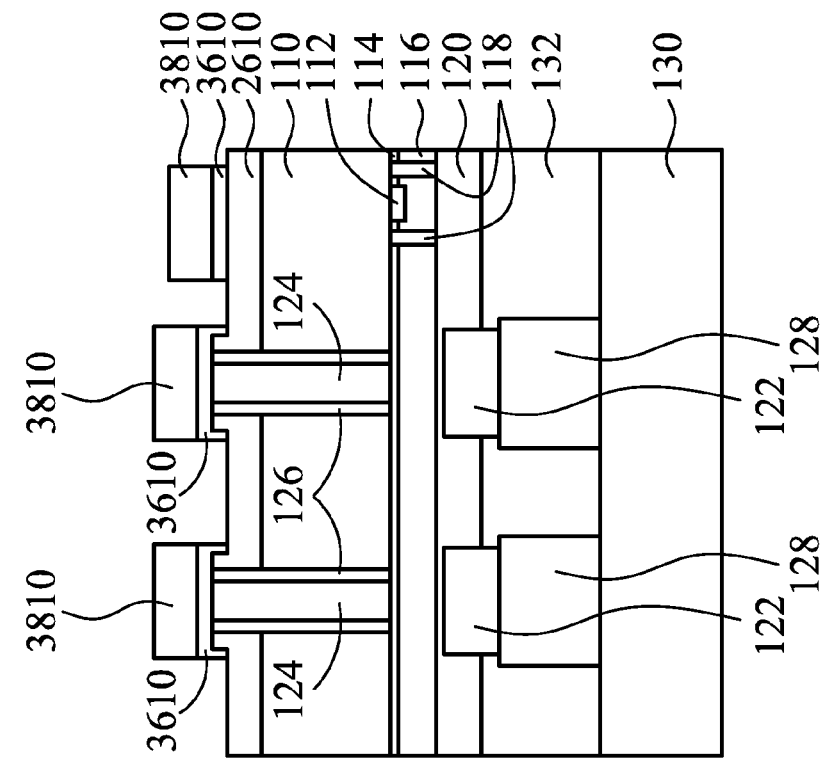

FIG. 39 illustrates the removal of the first patterned mask 3710 (see FIGS. 37 and 38) in accordance with an embodiment. In an embodiment in which the first patterned mask 3710 is a photoresist mask, a plasma ashing or wet strip process may be used to remove the first patterned mask 3710. One suitable ashing process comprises an $O_2$ plasma ashing process.

FIG. 39 also illustrates removal of the exposed portions of the first seed layer 3610. Exposed portions of the first seed layer 3610 may be removed by, for example, a wet etching process.

Figure 40:
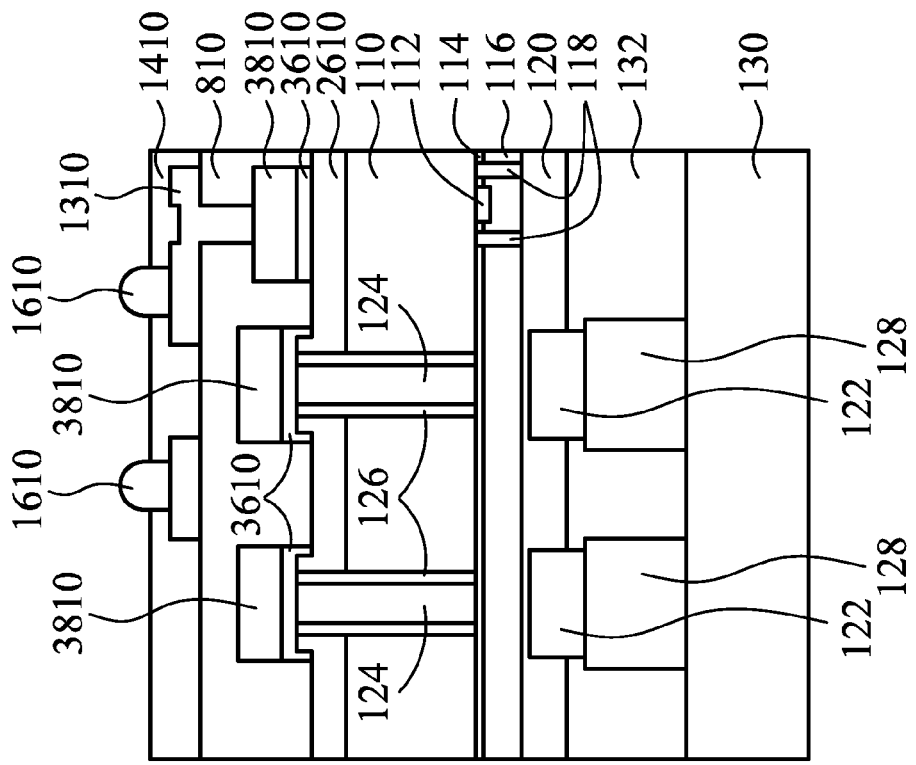

FIG. 40 illustrates the structure of FIG. 39 after the second isolation film 810, the second conductive elements 1310, the third isolation film 1410, and the connection elements 1610 are formed. The second isolation film 810, the second conductive elements 1310, the third isolation film 1410, and the connection elements 1610 may be formed as discussed above with reference to FIGS. 8-16.

Thereafter, other back-end-of-line (BEOL) processing techniques suitable for the particular application may be performed. For example, the carrier substrate 130 may be removed, an encapsulant may be formed, a singulation process may be performed to singulate individual dies, wafer-level or die-level stacking, and the like, may be performed. It should be noted, however, that embodiments may be used in many different situations. For example, embodiments may be used in a die-to-die bonding configuration, a die-to-wafer bonding configuration, or a wafer-to-wafer bonding configuration.

One of ordinary skill in the art will realize that the processes above utilize a non-damascene process to form the conductive elements of the redistribution layers. As a result, planarizing processes such as CMP may be reduced while providing good planarity with low temperature dielectric films. Processes such as those described above also prevent or reduce diffusion issues as opposed to some other methods that utilize CMP techniques.

Although the embodiments and their advantages have been described in detail, it should be understood that various changes, substitutions and alterations can be made herein without departing from the spirit and scope of the embodiments as defined by the appended claims. Moreover, the scope of the present application is not intended to be limited to the particular embodiments of the process, machine, manufacture, and composition of matter, means, methods and steps described in the specification. As one of ordinary skill in the art will readily appreciate from the disclosure, processes, machines, manufacture, compositions of matter, means, methods, or steps, presently existing or later to be developed, that perform substantially the same function or achieve substantially the same result as the corresponding embodiments described herein may be utilized according to the disclosure. Accordingly, the appended claims are intended to include within their scope such processes, machines, manufacture, compositions of matter, means, methods, or steps. In addition, each claim constitutes a separate embodiment, and the combination of various claims and embodiments are within the scope of the disclosure.

What is claimed is:

1. A semiconductor device comprising:
   a first substrate;
   a through-substrate via comprising a single continuous structure extending from a first side of the first substrate through the first substrate and protruding from a second side of the first substrate by a first distance, the through-substrate via electrically coupled to an electrical device disposed on the first side of the first substrate;
   a first isolation film on the second side of the first substrate, the first isolation film having a thickness less than the first distance, wherein the through-substrate via is exposed above the first isolation film;
   a first conductive element on the through-substrate via, the first conductive element extending over the first isolation film;
   a second isolation film on the first isolation film and the first conductive element; and
   a second conductive element electrically coupled to the first conductive element and extending over an upper surface of the second isolation film.

2. The semiconductor device of claim 1, wherein the first isolation film is a different material than the second isolation film.

3. The semiconductor device of claim 1, wherein at least one of the first isolation film and the second isolation film is a composite layer.

4. The semiconductor device of claim 1, further comprising a liner along sidewalls of the through-substrate via.

5. The semiconductor device of claim 1, further comprising a third isolation film over the second isolation film and the second conductive element.

6. The semiconductor device of claim 5, further comprising a connection element electrically coupled to the second conductive element.

7. A semiconductor device comprising:
   through-substrate vias extending through a first substrate and in electrical contact with an electrical device on a frontside of the first substrate, the through-substrate vias protruding from a backside of the first substrate by a first distance;
   a first isolation film on the backside of the first substrate between adjacent ones of the through-substrate vias, the first isolation film having a thickness less than the first distance;
   liners disposed in the first substrate, each one of the liners in contact with respective ones of the through-substrate vias, the liners extending above a lower surface of the first isolation film;
   first conductive elements being in electrical contact with respective ones of the through-substrate vias and extending over the first isolation film;
   a second isolation film over the first conductive elements; and
   second conductive elements being in electrical contact with respective ones of the first conductive elements and extending over the second isolation film.

8. The semiconductor device of claim 7, further comprising a third isolation film over the second redistribution layer and at least one of the second conductive elements.

9. The semiconductor device of claim 7, further comprising one or more connection elements, each of the one or more connection elements electrically coupled to at least one of the second conductive elements.

10. The semiconductor device of claim 7, wherein the through-substrate via is electrically coupled to the electrical device through one or more intermetal dielectric layers disposed on the frontside of the substrate.

11. The semiconductor device of claim 7, wherein a bottonmost surface of the first conductive elements extend below a topmost surface of the through vias.

12. A semiconductor device comprising:
   a substrate having one or more through-substrate vias extending from a circuit-side to a backside of the substrate, wherein the backside of the substrate is recessed such that the through-substrate vias protrude from the backside of the substrate;
   a first redistribution layer comprising:
      a first isolation film over the backside of the substrate; and first conductive elements electrically coupled to respective ones of the one or more through-substrate vias, respective ones of the one or more through-substrate vias extending above a lower surface of respective ones of the first conductive elements, the first conductive elements extending over an upper surface of the first isolation film; and one or more additional redistribution layers, each additional redistribution layer comprising:
an additional isolation film over an uppermost isolation film; and
additional conductive elements electrically coupled to respective ones of the underlying conductive elements, the additional conductive elements extending over an upper surface of the respective additional isolation film.

13. The semiconductor device of claim 12 wherein the one or more through-substrate vias protrude from the backside the substrate by a first distance and wherein the first isolation film has a thickness less than the first distance.

14. The semiconductor device of claim 12 wherein the one or more through-substrate vias protrude through the first isolation film.

15. The semiconductor device of claim 12, wherein at least one of the one or more through-substrate vias is in electrical contact with a device disposed on the circuit-side of the substrate.

16. The semiconductor device of claim 12, further comprising a top isolation film over an uppermost redistribution layer.

17. The semiconductor device of claim 12, further comprising one or more connection elements, each of the one or more connection elements electrically coupled to at least one of the additional conductive elements of the uppermost redistribution layer.

18. The semiconductor device of claim 12, wherein the first isolation film is a different material than the additional isolation films of the one or more additional redistribution layers.

19. The semiconductor device of claim 12, wherein at least one of the first isolation film and additional isolation films are a composite layer.

20. The semiconductor device of claim 12, further comprising a liner along sidewalls of the through-substrate vias.

* * * * *